United States Patent
Matsushita et al.

(10) Patent No.: US 10,490,389 B2
(45) Date of Patent: Nov. 26, 2019

(54) ION IMPLANTER AND ION IMPLANTATION METHOD

(71) Applicant: SUMITOMO HEAVY INDUSTRIES ION TECHNOLOGY CO., LTD., Tokyo (JP)

(72) Inventors: Hiroshi Matsushita, Ehime (JP); Yoshiaki Oogita, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 0 days.

(21) Appl. No.: 15/994,221

(22) Filed: May 31, 2018

(65) Prior Publication Data

US 2018/0350559 A1    Dec. 6, 2018

(30) Foreign Application Priority Data

May 31, 2017    (JP) ................. 2017-107477

(51) Int. Cl.
| H01J 37/317 | (2006.01) |
| H01J 37/02 | (2006.01) |
| H01J 37/05 | (2006.01) |
| H01J 37/147 | (2006.01) |
| H01J 27/02 | (2006.01) |

(52) U.S. Cl.
CPC ........ H01J 37/3171 (2013.01); H01J 27/024 (2013.01); H01J 37/023 (2013.01); H01J 37/05 (2013.01); H01J 37/1472 (2013.01)

(58) Field of Classification Search
CPC ...... H01J 37/3171; H01J 37/023; H01J 37/05; H01J 37/1472; H01J 27/024

USPC ............................................. 250/492.1, 492.3
See application file for complete search history.

(56) References Cited

U.S. PATENT DOCUMENTS

| 6,462,347 B1 | 10/2002 | Oh |
| 6,608,315 B1 | 8/2003 | Saadatmand et al. |
| 7,351,987 B2 | 4/2008 | Kabasawa et al. |
| 2016/0071713 A1* | 3/2016 | Farmer, III ............. H01J 49/04 250/282 |
| 2018/0350557 A1* | 12/2018 | Matsushita ........... H01J 37/304 |

FOREIGN PATENT DOCUMENTS

| JP | H09-137702 A | 5/1997 |
| JP | 2000-156172 A | 6/2000 |
| JP | 3896543 B2 | 3/2007 |
| JP | 2012-048941 A | 3/2012 |
| JP | 4901094 B2 | 3/2012 |
| JP | 2015-043272 A | 3/2015 |

* cited by examiner

Primary Examiner — Nicole M Ippolito
(74) Attorney, Agent, or Firm — Michael Best & Friedrich LLP

(57) ABSTRACT

An ion implanter includes an ion source configured to generate an ion beam including an ion of a first nonradioactive nuclide, a beamline configured to support an ion beam irradiated target formed of a solid material including a second nonradioactive nuclide different from the first nonradioactive nuclide, and a controller configured to calculate at least one of an estimated radiation dosage of a radioactive ray and an estimated generation amount of a radioactive nuclide generated by a nuclear reaction between the first nonradioactive nuclide and the second nonradioactive nuclide.

16 Claims, 12 Drawing Sheets

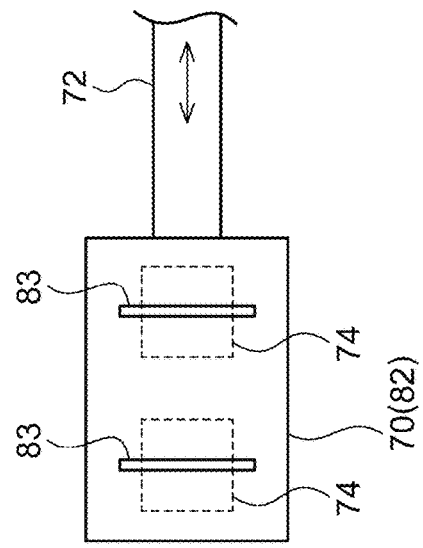
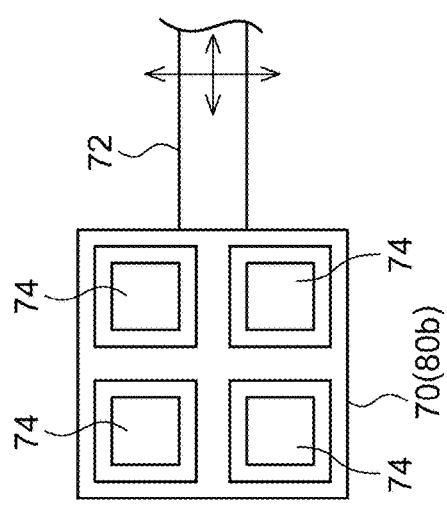
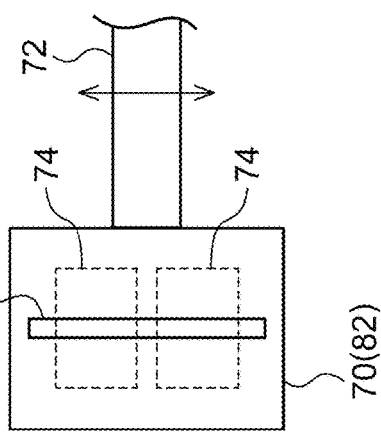

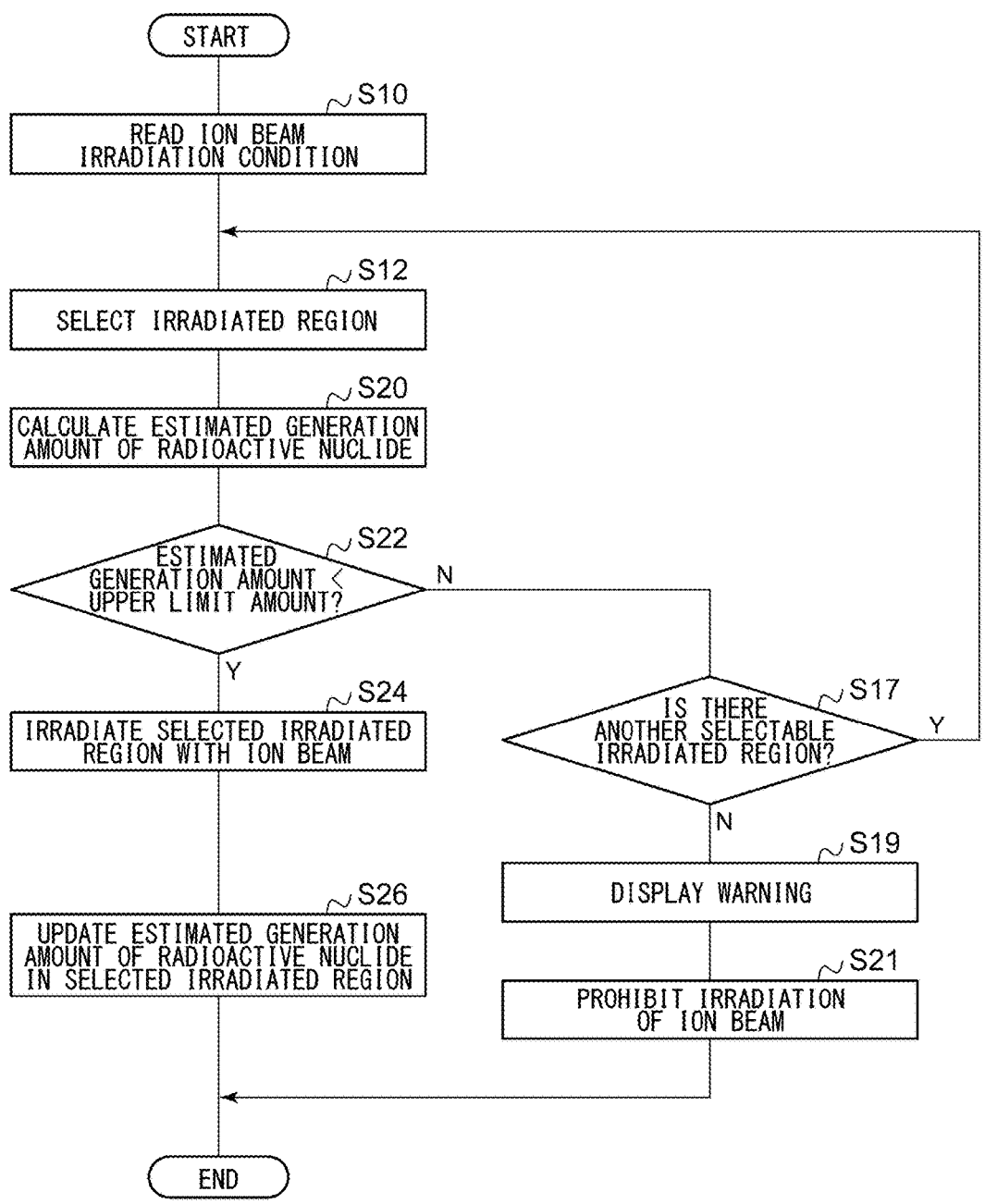

ION IMPLANTER AND ION IMPLANTATION METHOD

RELATED APPLICATIONS

Priority is claimed to Japanese Patent Application No. 2017-107477, filed May 31, 2017, the entire content of which is incorporated herein by reference.

BACKGROUND

Technical Field

Certain embodiment of the present invention relates to an ion implanter and an ion implantation method.

Description of Related Art

In the related art, an ion converter is known, which includes a member which is installed on a traveling path of an ion beam and through which the ion beam can transmit and a polarity conversion material which is coated on a surface of the member such that a polarity of the ion in the ion beam is converted by collision between the polarity conversion material and the ion beam.

SUMMARY

According to an embodiment of the present invention, there is provided an ion implanter, including: an ion source configured to generate an ion beam including an ion of a first nonradioactive nuclide; a beamline configured to support anion beam irradiated target formed of a solid material including a second nonradioactive nuclide different from the first nonradioactive nuclide; and a controller configured to calculate at least one of an estimated radiation dosage of a radioactive ray and an estimated generation amount of a radioactive nuclide generated by a nuclear reaction between the first nonradioactive nuclide and the second nonradioactive nuclide.

According to another embodiment of the present invention, there is provided an ion implanter, including: an ion source configured to generate an ion beam including an ion of a first nonradioactive nuclide; a beamline configured to support an ion beam irradiated target including a first irradiated region and a second irradiated region; and a controller configured to select the first irradiated region in a case where an energy of the ion beam is in a first energy range and to select the second irradiated region in a case where the energy of the ion beam is in a second energy range higher than the first energy range, in which the beamline includes a relative position adjustment mechanism configured to adjust a relative position between the ion beam irradiated target and the ion beam such that the ion of the first nonradioactive nuclide is incident into the selected irradiated region, the first irradiated region is formed of a first solid material including a second nonradioactive nuclide different from the first nonradioactive nuclide, and the second irradiated region is formed of a second solid material which includes the second nonradioactive nuclide with a concentration lower than the concentration of the second nonradioactive nuclide in the first solid material or does not include the second nonradioactive nuclide.

According to still another embodiment of the present invention, there is provided an ion implantation method, including: generating an ion beam including an ion of a first nonradioactive nuclide; supporting an ion beam irradiated target formed of a solid material including a second nonradioactive nuclide different from the first nonradioactive nuclide; and calculating at least one of an estimated radiation dosage of a radioactive ray and an estimated generation amount of a radioactive nuclide generated by a nuclear reaction between the first nonradioactive nuclide and the second nonradioactive nuclide.

BRIEF DESCRIPTION OF THE DRAWINGS

FIGS. 6A to 6C are schematic views each of which shows a switching structure having a plurality of irradiated regions provided in an ion beam irradiated target.

FIG. 10 is a flowchart showing another switching process of the irradiated regions of the ion beam irradiated target according to the embodiment.

DETAILED DESCRIPTION

Figure 1:
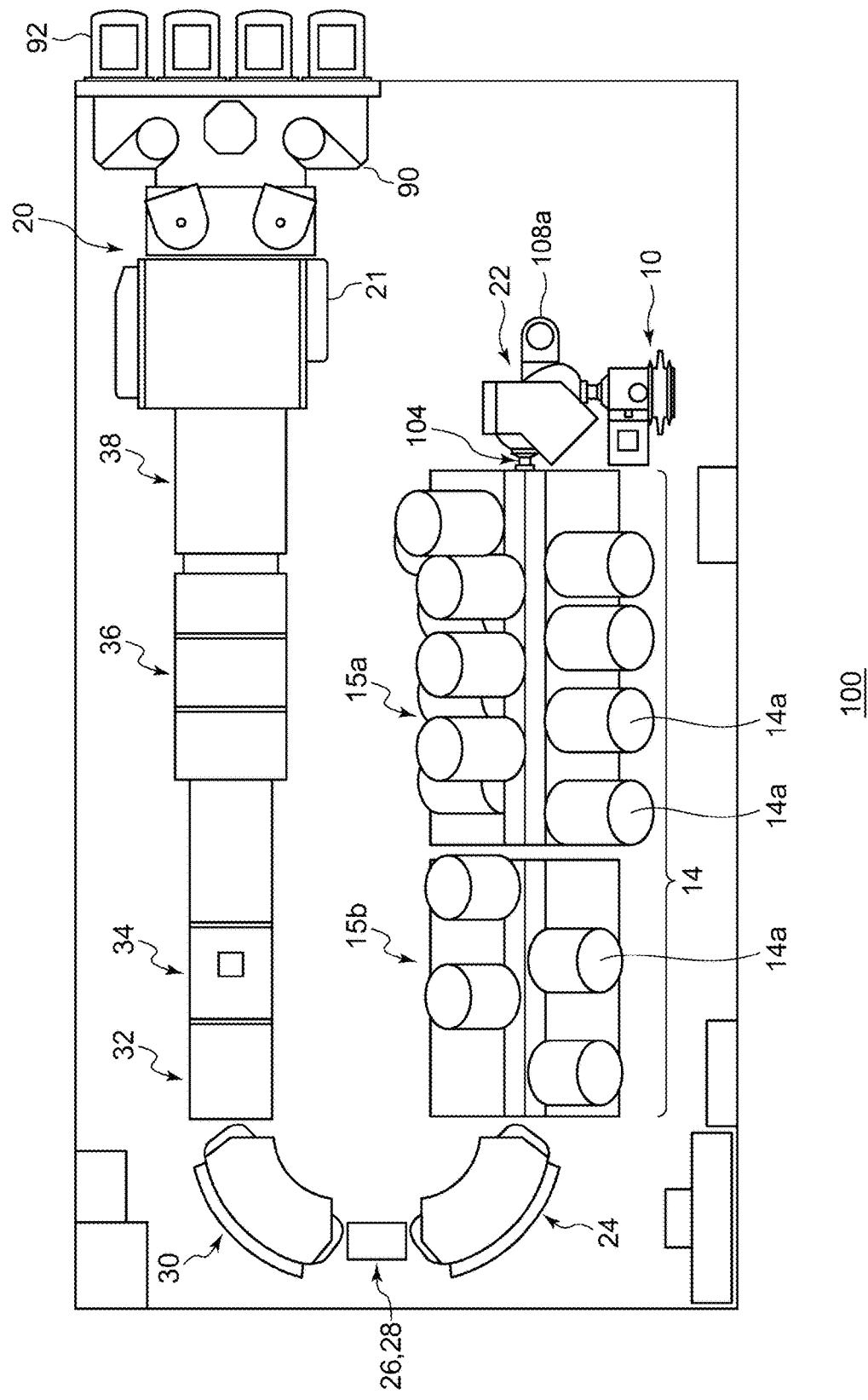
FIG. 1 is a top view schematically showing an ion implanter according to an embodiment of the present invention.

In a semiconductor manufacturing process, a process of implanting ions into a semiconductor wafer is generally performed in order to change conductivity of the semiconductor wafer, to change a crystal structure of the semiconductor wafer, or the like. In general, a device used in this process is referred to as an ion implanter. An ion implantation energy is determined according to a desired implantation depth of ions implanted into a wafer surface. A low energy ion beam is used for implantation into a shallow region and a high energy ion beam is used for implantation into a deep region.

In recent years, there is an increasing demand for so-called ultrahigh energy ion implantation using an ion beam having a higher energy compared to high energy ion implantation of the related art for implantation into a deeper region. An ion accelerated to an ultrahigh energy collides with a member which is provided in a beamline of the ion implanter, and thus, there is a possibility that a nuclear reaction is induced. According to the induced nuclear reaction, a radioactive ray such as neutron ray and a gamma ray may be generated. Radioactive substances may be generated in some cases.

It is desirable to cope with a nuclear reaction caused by a use of an ion beam having a relatively high energy.

Aspects of the present invention include any combination of the above-described constituent elements, or mutual substitution of constituent elements or expressions of the present invention among methods, apparatuses, systems, computer programs, data structures, recording media, or the like.

According to the present invention, it is possible to cope with a nuclear reaction caused by a use of an ion beam having a relatively high energy.

Hereinafter, an embodiment of the present invention will be described in detail with reference to the drawings. In descriptions and the drawings, the same reference numerals are assigned to the same or equivalent constituent elements, members, and process, and overlapping descriptions are appropriately omitted. The scales and shapes of the respective portions shown in the drawings are set for the sake of convenience in order to facilitate explanation and are not to be interpreted limitedly unless otherwise mentioned. The embodiment is an example and does not limit the scope of the present invention. All the features and combinations thereof described in the embodiments are not necessarily essential to the invention.

Figure 2:
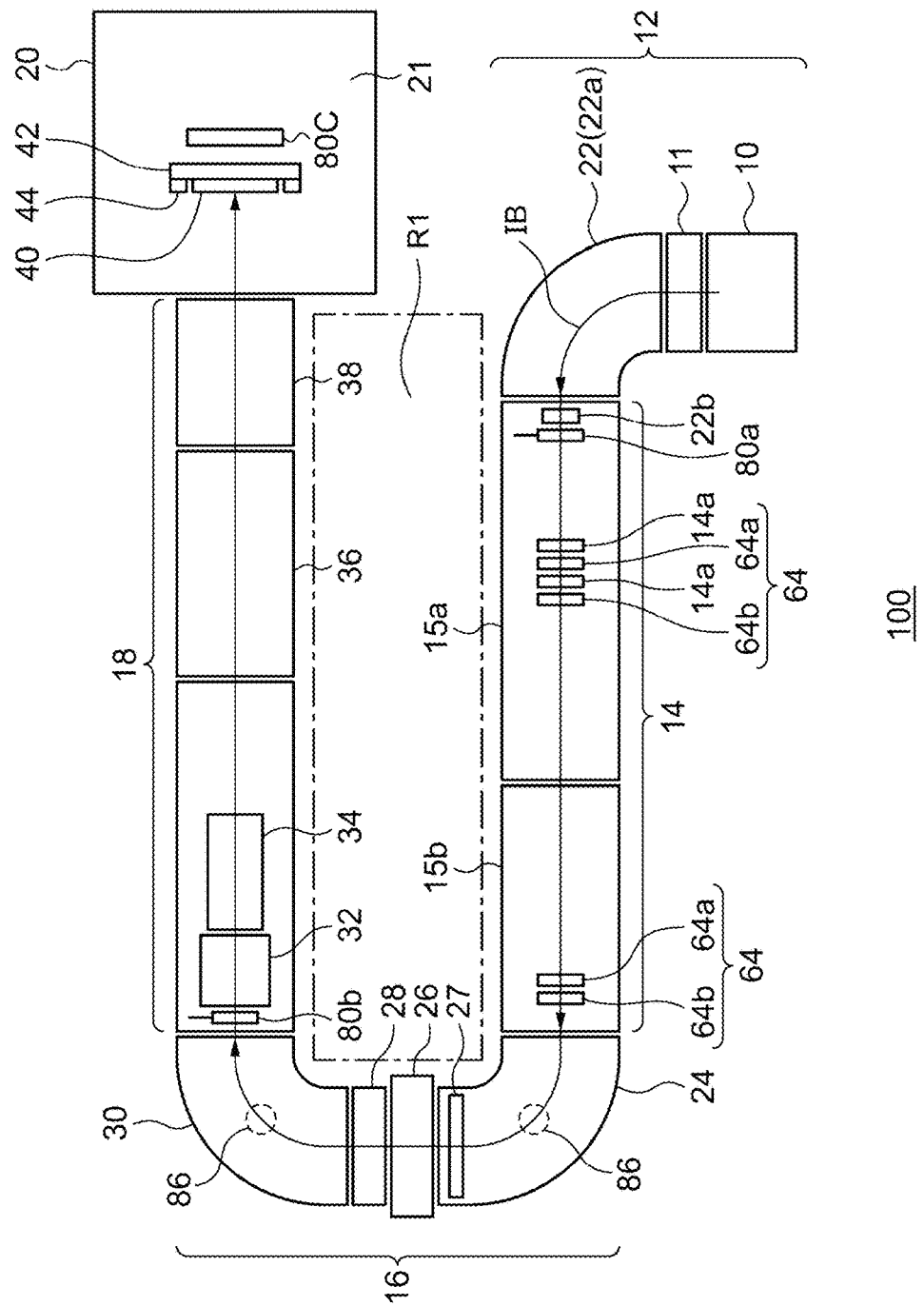
FIG. 2 is a view schematically showing a disposition of constituent elements of the ion implanter shown in FIG. 1.

FIG. 1 is a top view schematically showing an ion implanter 100 according to an embodiment of the present invention. FIG. 2 is a view schematically showing a disposition of constituent elements of the ion implanter 100 shown in FIG. 1. The ion implanter 100 is a so-called high energy ion implanter. The high energy ion implanter is an ion implanter which includes a radio frequency linear acceleration type ion acceleration unit and a high energy ion transport beamline. The high energy ion implanter accelerates an ion generated in an ion source 10 to a high energy, transports the ion to a workpiece (for example, a substrate or a wafer 40) along a beamline, and implants the ion to the workpiece.

As shown in FIG. 1 and/or FIG. 2, the ion implanter 100 includes an ion beam generating unit 12 which generates an ion and separates mass thereof, a high energy multistage linear acceleration unit 14 which accelerates the ion supplied from the ion beam generating unit 12 according to an acceleration parameter, a beam deflecting unit 16 which bends a trajectory of the ion beam IB in a U shape, a beam transport line unit 18 which transports the ion beam IB to a wafer 40, and a substrate supplying/processing unit 20 which uniformly implants the transported ion beam IB to the semiconductor wafer.

As shown in FIG. 2, the ion beam generating unit 12 includes an ion source 10, an extraction electrode 11, and a mass analyzer 22. In the ion beam generating unit 12, an ion beam is extracted from the ion source 10 and accelerated through the extraction electrode 11, and the extracted and accelerated ion beam is mass-analyzed by the mass analyzer 22. The mass analyzer 22 includes a mass analyzing magnet 22a and a mass resolving slit 22b. The mass resolving slit 22b is disposed in an entrance of the high energy multistage linear acceleration unit 14 which is a constituent element following the mass analyzer 22. The mass resolving slit 22b may be disposed immediately after the mass analyzing magnet 22a (that is, immediately before the high energy multistage linear acceleration unit 14).

A first beam measuring instrument 80a for measuring a total beam current of the ion beam is disposed at a forefront portion in the linear accelerator housing of the high energy multistage linear acceleration unit 14. The first beam measuring instrument 80a is configured so as to be inserted into or retracted from the beam trajectory in a vertical direction by a drive mechanism. For example, the first beam measuring instrument 80a is a faraday cup. This faraday cup is referred to as an injector faraday cup. The injector faraday cup has a rectangular parallelepiped shape spreading in a horizontal direction and is configured such that an opening portion thereof faces an upstream side of the beamline. The first beam measuring instrument 80a is used to measure a total beam current of the ion beam IB when the ion source 10 and/or the mass analyzing magnet 22a is adjusted. The first beam measuring instrument 80a may be used to completely block the ion beam IB reaching a downstream side of the beamline on the beam trajectory as necessary.

As a result of the mass analysis by the mass analyzer 22, only the ion species necessary for implantation is selected, and the ion beam IB of the selected ion species is introduced to the following high energy multistage linear acceleration unit 14. The high energy multistage linear acceleration unit 14 includes a first linear acceleration unit 15a used for normal high energy ion implantation. The first linear acceleration unit 15a includes one or more (for example, a plurality of) radio frequency resonators 14a. The high energy multistage linear acceleration unit 14 may include a second linear acceleration unit 15b in addition to the first linear acceleration unit 15a. The second linear acceleration unit 15b is used along with the first linear acceleration unit 15a for ultrahigh energy ion implantation and other ion implantation. The second linear acceleration unit 15b includes one or more (for example, a plurality of) radio frequency resonators 14a. A direction of the ion beam IB accelerated by the high energy multistage linear acceleration unit 14 is changed by the beam deflecting unit 16.

The first linear acceleration unit 15a includes the plurality of radio frequency resonators 14a and a plurality of focusing/defocusing lenses 64. Each of the radio frequency resonator 14a includes a tubular electrode. For example, each of the focusing/defocusing lenses 64 is an electric field lens (for example, electrostatic quadrupole electrode (Q lens)). The focusing/defocusing lenses 64 may be a magnetic field lens (for example, quadrupole magnet). The tubular electrodes of the radio frequency resonators 14a and the focusing/defocusing lenses 64 (for example, Q lenses) are alternately arranged in a line, and the ion beam IB passes through the centers thereof. Similarly to the first linear acceleration unit 15a, the second linear acceleration unit 15b includes the plurality of radio frequency resonators 14a and the plurality of focusing/defocusing lenses 64.

The focusing/defocusing lenses 64 are provided to control convergence and divergence of the ion beam IB during the acceleration or after the acceleration and effectively transport the ion beam IB. The focusing/defocusing lenses 64 as many as necessary are disposed inside a radio frequency linear acceleration unit, and in the upstream side of and/or in the downstream side of the radio frequency linear acceleration unit. Horizontal focusing lenses 64a and vertical focusing lenses 64b are alternately arranged. That is, the horizontal focusing lens 64a is disposed in front of (or behind) the tubular electrode of the radio frequency resonator 14a, the vertical focusing lens 64b is disposed behind (or in front of) the tubular electrode of the radio frequency resonator 14a. An additional vertical focusing lens 64b is disposed behind the horizontal focusing lens 64a at the final end of the second linear acceleration unit 15b. The convergence and the divergence of the ion beam IB passing through the high energy multistage linear acceleration unit 14 are adjusted, and thus, the ion beam IB having an optimal two-dimensional beam profile is incident into the beam deflecting unit 16 positioned at a stage subsequent to the high energy multistage linear acceleration unit 14.

In the radio frequency linear acceleration unit, an amplitude V [kV] and a frequency f [Hz] of a voltage applied to the tubular electrode of each radio frequency resonator $14a$ are considered as acceleration parameters of the radio frequency (RF). In a case where radio frequency accelerations are performed in a plurality of stages, a phase φ [deg] between the radio frequency resonators $14a$ is added as the acceleration parameter. The amplitude V, the frequency f, and the phase φ are parameters of the radio frequency (RF). A fixed value may be used for the frequency f. Operating parameters (referred to as focusing/defocusing parameters) of the focusing/defocusing lenses 64 are also considered. For example, the focusing/defocusing parameter is a Q lens voltage.

The high energy ion beam IB exiting from the high energy multistage linear acceleration unit 14 has a range of energy distribution. Therefore, in order to irradiate the wafer 40 with the high energy ion beam IB subjected to scanning and parallelization, at desired implantation accuracy, it is desirable to perform highly accurate energy analysis, a trajectory correction, and a beam convergence/divergence adjustment in advance.

The beam deflecting unit 16 performs the energy analysis, the trajectory correction, and the control of the energy dispersion of the high energy ion beam. The beam deflecting unit 16 includes at least two high accuracy deflecting electromagnets, at least one of an energy width limiting slit and an energy resolving slit, and at least one lateral focusing device. The plurality of deflecting electromagnets are configured to perform the energy analysis of the high energy ion beam, an accurate correction of an ion implantation angle, and a suppression of the energy dispersion.

The beam deflecting unit 16 includes an Energy Filter Magnet 24, an energy width limiting slit 27, a horizontal focusing quadrupole lens 26, an energy resolving slit 28, and a steering magnet 30 in this order from the upstream side. The Energy Filter Magnet 24 is disposed on the downstream side of the high energy multistage linear acceleration unit 14. The horizontal focusing quadrupole lens 26 controls the energy dispersion. The steering magnet 30 provides beam steering (trajectory correction). The direction of the ion beam IB is changed by the beam deflecting unit 16 and thus, the ion beam IB is directed in a direction to the wafer 40.

A second beam measuring instrument 80b which measures the beam current is provided on the downstream side of the steering magnet 30. The second beam measuring instrument 80b is disposed in the forefront portion in a scanner housing, that is, immediately in front of a beam shaper 32. The second beam measuring instrument 80b is configured so as to be inserted into or retracted from the beam trajectory in the vertical direction by a drive mechanism. For example, the second beam measuring instrument 80b is a faraday cup. This faraday cup is referred to as a resolver faraday cup. The resolver faraday cup has a rectangular parallelepiped shape spreading in the horizontal direction and is configured such that an opening portion thereof faces the upstream side of the beamline. The second beam measuring instrument 80b is used to measure the total beam current of the ion beam IB when the high energy multistage linear acceleration unit 14 and/or the beam deflecting unit 16 is adjusted. The second beam measuring instrument 80b may be used to completely block the ion beam IB reaching the downstream side the beamline on the beam trajectory as necessary.

The Energy Filter Magnet 24 is the most upstream-side magnet among the plurality of deflecting electromagnets of the beam deflecting unit 16. The steering magnet 30 is the most downstream-side magnet among the plurality of deflecting electromagnets of the beam deflecting unit 16.

A centrifugal force and a Lorentz force are applied to the ion passing through the deflecting electromagnet of the beam deflecting unit 16 and are balanced to each other to draw an arc-shaped trajectory. This balance is represented by Expression mv=qBr. m is mass of the ion, v is velocity of the ion, q is an electric charge of the ion, B is a magnetic flux density of the deflecting electromagnet, and r is a curvature radius of the trajectory. Only the ion whose curvature radius r of the trajectory coincides with a curvature radius of a magnetic pole center of the deflecting electromagnet can pass through the deflecting electromagnet. In other words, in a case where the electric charge of the ions are the same as each other, only the ion having a specific momentum mv can pass through the deflecting electromagnet to which a constant magnetic field B is applied. In actual, the Energy Filter Magnet 24 is a device which analyzes the momentum of the ion. Similarly, the steering magnet 30 or the mass analyzing magnet 22a is a momentum filter.

The beam deflecting unit 16 can deflect ion beam IB by 180° by using a plurality of magnets. Accordingly, it is possible to realize a high energy ion implanter, in which the beamline is formed in a U shape, by a simple configuration. The Energy Filter Magnet 24 and the steering magnet 30 are each configured to have a deflection angle of 90° such that the total deflection angle becomes 180°. A deflection amount performed by one magnet is not limited to 90°, and the following combinations may be used.

(1) one magnet having the deflection amount of 90° and two magnets each having the deflection amount of 45°

(2) three magnets each having the deflection amount of 60°

(3) four magnets each having the deflection amount of 45°

(4) six magnets each having the deflection amount of 30°

(5) one magnet having the deflection amount of 60° and one magnet having the deflection amount of 120°

(6) one magnet having the deflection amount of 30° and one magnet having the deflection amount of 150°

High accuracy of the magnetic field is required for the Energy Filter Magnet 24, and thus, a magnetic field measurement unit 86 having high accuracy for a magnetic field measurement is attached. The magnetic field measurement unit 86 is an appropriate combination of an NMR (nuclear magnetic resonance) probe (also referred to as MRP (magnetic resonance probe)) and an Hall probe, the MRP is used to calibrate the Hall probe, and the Hall probe is used to constantly feedback-control the magnetic field. The Energy Filter Magnet 24 is manufactured with strict accuracy so that the nonuniformity of the magnetic field is less than 0.01%. Similarly, the magnetic field measurement unit 86 is provided in the steering magnet 30. Only the Hall probe may be attached to the magnetic field measurement unit 86 of the steering magnet 30. A power supply whose current setting accuracy and current stability is within $1 \times 10^{-4}$ and a control unit of the power supply are connected to each of the Energy Filter Magnet 24 and the steering magnet 30.

The beam transport line unit 18 transports the ion beam IB emitted from the beam deflecting unit 16, and includes the beam shaper 32 including a focusing/defocusing lens group, a beam scanner 34, a beam parallelizer 36, and an electrostatic final energy filter 38. The final energy filter 38 includes a final energy separation slit. A length of the beam transport line unit 18 is designed according to a total length of the ion beam generating unit 12 and the high energy multistage linear acceleration unit 14. The beam transport line unit 18 is connected to the high energy multistage linear acceleration unit 14 via the beam deflecting unit 16 to form a U-shaped layout as a whole.

The substrate supplying/processing unit 20 is provided at the termination on the downstream side of the beam transport line unit 18. The substrate supplying/processing unit 20 includes a vacuum processing chamber 21 for irradiating the wafer 40 with the ion beam IB in the implantation processing. A beam monitor which measure abeam current, a beam position, an implant angle, a convergent/divergent angle, an ion distribution in vertical and horizontal directions of the ion beam IB, a charge neutralizing device which prevents the wafer 40 from being charged by the ion beam IB, a wafer transfer mechanism which loads and unloads the wafers 40 so as to set the wafer 40 at an appropriate position and angle, an ESC (Electrostatic Chuck) which holds the wafer 40 during ion implantation, and a wafer scanning mechanism which moves a wafer 40 in a direction perpendicular to the beam scan direction at a speed according to the beam current measured during implantation are accommodated in the vacuum processing chamber 21.

In the substrate supplying/processing unit 20, a third beam measuring instrument 80c is provided behind the ion implantation position. For example, the third beam measuring instrument 80c is a fixed type of horizontally spreading faraday cup which measures the total beam current of the ion beam IB. This horizontally spreading faraday cup is also referred to as a tuning faraday cup. The third beam measuring instrument 80c has a beam current measuring function capable of measuring the beam current over the entire scanning range of the ion beam IB in a wafer region. The third beam measuring instrument 80c is configured to measure the final set-up beam the most downstream side of the beam trajectory.

In the substrate supplying/processing unit 20, as shown in FIG. 1, a wafer transfer device 90 is provided adjacent to the vacuum processing chamber 21. The wafer transfer device 90 includes an intermediate transfer chamber, a load lock chamber, and an atmospheric transfer section. The wafer transfer device 90 is configured to transfer a workpiece such as the wafer stored in a cassette station 92 into the vacuum processing chamber 21. The wafer is loaded from the cassette station 92 into the vacuum processing chamber 21 via the atmospheric transfer section, the load lock chamber, and the intermediate transfer chamber. Meanwhile, the wafer subjected to the ion implantation processing is carried out to the cassette station 92 via the intermediate transfer chamber, the load lock chamber, and the atmospheric transfer section.

In this manner, a beamline portion of the ion implanter 100 is configured as a horizontal U-shaped folded beamline having two opposed long straight portions. The upstream long straight portion includes the plurality of units which accelerate the ion beam IB extracted from by the ion source 10. The downstream long straight portion includes the plurality of units which adjust the ion beam IB whose direction is turned from that in the upstream long straight portion and implant the ion beam IB into the wafer 40. The two long straight portions are configured to have substantially the same length. A work space R1 having a sufficient size for a maintenance work is provided between the two long straight portions.

In the high energy ion implanter having units disposed in a U shape, good workability is secured while a foot print thereof is suppressed. In the high energy ion implanter, the units and devices are configured as a module, and thus, the units and devices can be installed and uninstalled according to a beamline reference position.

The high energy multistage linear acceleration unit 14 and the beam transport line unit 18 are disposed in a folded manner, and thus, the total length of the high energy ion implanter can be suppressed. In the related art, the high energy multistage linear acceleration unit 14 and the beam transport line unit 18 are disposed approximately straightly. The curvature radius of each of the plurality of deflecting electromagnets configuring the beam deflecting unit 16 is optimized to minimize the device width. Accordingly, the foot print of the device is minimized, and in the work space R1 interposed between the high energy multistage linear acceleration unit 14 and the beam transport line unit 18, it is possible to work for each device of the high energy multistage linear acceleration unit 14 and the beam transport line unit 18. The ion source 10 having a relatively short maintenance interval and the substrate supplying/processing unit 20 requiring the loading/unloading of the substrate are disposed adjacent to each other, and a movement of an operator can be reduced.

Meanwhile, the ion implanter 100 may be configured to enable ultrahigh energy ion implantation. Here, for example, the ultrahigh energy means an energy larger than or equal to 4 MeV or larger than or equal to 5 MeV. According to the ultrahigh energy ion implantation, desired dopant ions are implanted into the wafer surface at a higher energy than typical high energy ion implantation of the related art, and thus, the desired dopants can be implanted into a deeper region (for example, a depth 5 μm or more) of the wafer surface. For example, the ultrahigh energy ion implantation is used to form a P-type region and/or an N-type region, in the manufacture of a semiconductor device such as an advanced image sensor.

The ion source 10 is configured to generate the ion beam IB containing an ion of a first nonradioactive nuclide. The high energy multistage linear acceleration unit 14 can accelerate the ion beam IB generated by the ion source 10 to the ultrahigh energy higher than or equal to 5 MeV. The ion implanter 100 may have an additional linear acceleration mechanism capable of accelerating the ion beam IB to the ultrahigh energy. However, the acceleration unit of the ion implanter 100 is not limited to the linear acceleration mechanism. The ion implanter 100 may be equipped with a different type acceleration unit capable of accelerating the ion beam IB to the ultrahigh energy, for example, a tandem acceleration mechanism. The present invention is not limited to a specific ion acceleration system.

The ion implanter 100 includes the beamline configured to support an ion beam irradiated target. The ion beam irradiated target is formed of a solid material including a second nonradioactive nuclide different from the first nonradioactive nuclide. The beamline is connected to the downstream side of the high energy multistage linear acceleration unit 14 or the different type acceleration unit and can transport the ion beam IB accelerated to the ultrahigh energy by the acceleration unit. The ion beam irradiated target is disposed at the location where the irradiation is performed with the ion beam IB having the ultrahigh energy in the beamline.

The beamline includes a plurality of beamline constituent elements. For example, the beamline includes the Energy Filter Magnet 24, the horizontal focusing quadrupole lens 26, the energy width limiting slit 27, the energy resolving slit 28, the steering magnet 30, the beam shaper 32, the beam scanner 34, the beam parallelizer 36, the final energy filter 38, and the vacuum processing chamber 21, as the beamline constituent elements. The beamline includes beam current measuring instruments such as the second beam measuring instrument 80b or the third beam measuring instrument 80c, as the beamline constituent elements.

The ion beam irradiated target may be at least a part of the beamline constituent elements. For example, the ion beam irradiated target may be configured as at least a part of the beam deflection unit, an aperture plate, the beam shutter, the beam damper, the wafer support portion, or the wafer. The ion beam irradiated target may be configured as at least a part of the beam current measuring instrument provided for the beamline.

An irradiated region which is irradiated with the ion beam IB in the ion beam irradiated target may be the inner wall of the region to which the beam deflection magnetic field for deflecting the beam is applied in the Energy Filter Magnet 24 or the steering magnet 30. The irradiated region may be the aperture plate for separating the necessary components of the beam and may be an area including an aperture in the energy width limiting slit 27 or the energy resolving slit 28, for example. The irradiated region may be the beam shutter or the beam damper for blocking the beam. As mentioned above, the beam current measuring instrument may be used as the beam shutter or the beam damper. The irradiated region may be a beam deflecting electrode which generates a beam deflecting electric field which deflects the beam, and for example, may be a beam deflecting electrode of the beam shaper 32, the beam scanner 34, the beam parallelizer 36, or the final energy filter 38.

The irradiated region may be a beam detection surface of a faraday cup for ion current detection used for adjusting the beam, and, for example, may be a beam detection surface of the second beam measuring instrument 80b, the third beam measuring instrument 80c, or other beam current measuring instruments. The irradiated region may be a wafer support portion 44 such as a plate which is installed on the surface of a wafer drive mechanism 42 and is disposed around the wafer 40. The irradiated region may be a wafer 40 or a dummy wafer.

The inventors of the present invention found that in the ultrahigh energy ion implantation, a nuclear reaction may occur between the ion of the first nonradioactive nuclide which is incident into the ion beam irradiated target and the second nonradioactive nuclide contained in the ion beam irradiated target. As a result of the nuclear reaction, a radioactive ray such as neutron ray and a gamma ray may be generated. A radioactive nuclide may be generated. Even though the materials of the ion species used in the ion implantation and the ion beam irradiated target are the nonradioactive nuclide, a problem of the radioactive ray may occur. In the related art, in typical ion implantation, a high energy in which the nuclear reaction is so active as to be a practical problem is not used. Therefore, in the ion implanter of the related art, a need to deal with the nuclear reaction is not recognized.

For example, in a case where the first nonradioactive nuclide is $^{11}$B and the second nonradioactive nuclide is $^{12}$C, when the ion beam IB is incident into the ion beam irradiated target, the following nuclear reaction may occur. This nuclear reaction may be referred to as a B-C reaction below.

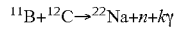
$$^{11}B + ^{12}C \rightarrow ^{22}Na + n + k\gamma$$

Here, n indicates a neutron, γ indicates a gamma ray, and k is an integer. A nuclear reaction rate (that is, the number of nuclear reactions per unit time) of the nuclear reaction by which the radioactive ray is generated may increase and an intensity of the radioactive ray may become significant as the incident energy increases and/or as the ion beam current increases. $^{22}$Na, which is a product due to the B-C reaction, is a radioactive nuclide. $^{22}$Na gradually decays into $^{22}$Ne with a half-life of 2.6 years, and generates gamma rays. Even in a case where the ion beam IB contains ions of another element such as deuteron, carbon and nitrogen having a relatively small atomic number, or even in a case where the ion beam irradiated target is formed of a solid material containing the element having a relatively small atomic number, the radioactive ray may be generated by the nuclear reaction caused by the irradiation of the ion beam IB to ion beam irradiated target.

Figure 3:
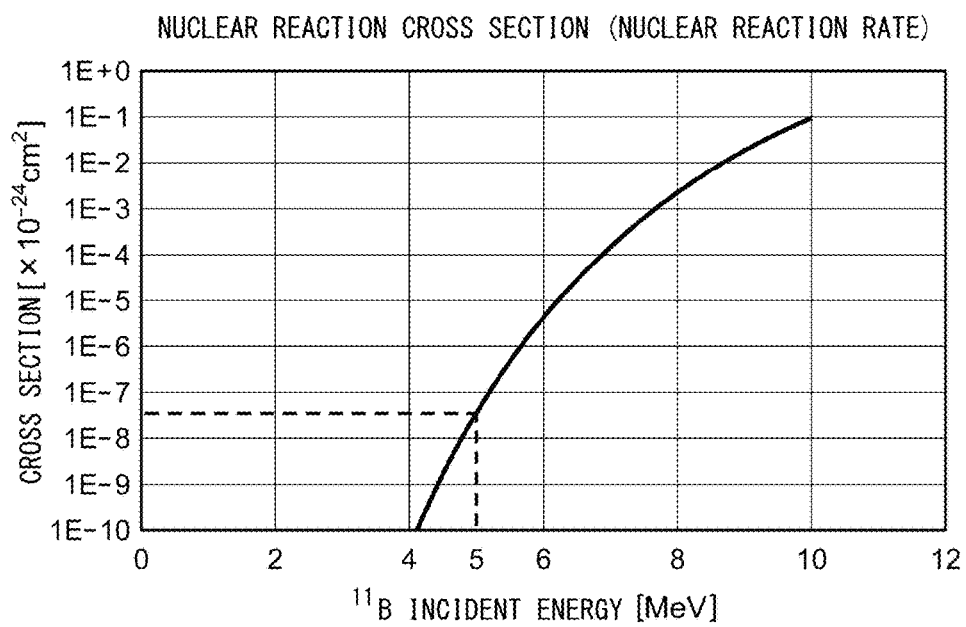
FIG. 3 is a graph showing a nuclear reaction cross section in a B-C reaction.

FIG. 3 is a graph showing a nuclear reaction cross section of the B-C reaction. A vertical axis of FIG. 3 indicates the nuclear reaction cross section between $^{11}$B and $^{12}$C, and a horizontal axis indicates the incident energy of $^{11}$B. The nuclear reaction cross section indicates a probability of occurrence of the nuclear reaction, and thus, the larger value represents that the nuclear reaction occurs more easily. FIG. 3 is a result of theoretical calculations. As shown in FIG. 3, in a case where the incident energy of $^{11}$B is an ultrahigh energy of 5 MeV or higher, the nuclear reaction cross section has a relatively large value, and thus, the B-C reaction tends to be the practical problem. Even in a case where the incident energy of $^{11}$B is the ultrahigh energy of 4 MeV to 5 MeV, the nuclear reaction cross section has a large value to some extent, and thus, the B-C reaction may be the practical problem. For example, if the beam current is large, the B-C reaction may occur significantly even in the case where the incident energy is 5 MeV or lower.

Figure 4:
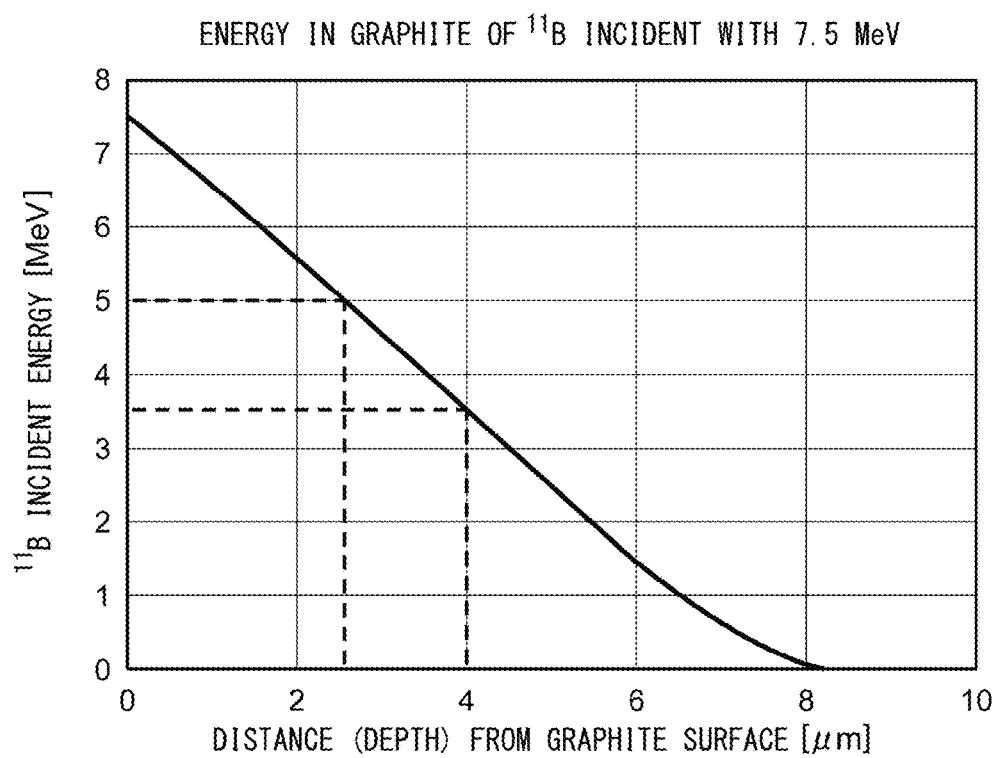
FIG. 4 is a graph showing an energy decay curve of boron.

FIG. 4 is a graph showing an energy decay curve of the $^{11}$B. The shown graph is the energy decay curve in a case where a material of the irradiated region is graphite and the $^{11}$B ion is incident into the surface of the irradiated region with the ultrahigh energy of 7.5 MeV. In general, the beam detection surface of the beam current measuring instrument such as the second beam measuring instrument 80b or the third beam measuring instrument 80c applied to the ion implanter 100 is formed of graphite. The irradiated regions of other ion beam irradiated targets such as the aperture plate, the beam shutter, or the beam damper are formed of graphite. In FIG. 4, the vertical axis indicates the energy of the $^{11}$B ion and the horizontal axis indicates the distance (depth) from the surface.

As shown, the energy of the $^{11}$B ion decreases as the depth increases. The energy of the $^{11}$B ion incident into the graphite decreases substantially linearly as the depth from the graphite surface increases. If as the incident energy of the $^{11}$B ion increases, the energy decay curve moves upward, and if the incident energy of the $^{11}$B ion decreases, the energy decay curve moves downwards. Regardless of change of the incident energy, the energy tends to decrease substantially linearly as the depth from the surface increases.

As in this example, in the case of the $^{11}$B ion having the incident energy of 7.5 MeV, the energy of 5 MeV or higher is maintained to the depth of 2.5 μm. Referring to FIG. 3, in a case where the energy of $^{11}$B ion is 5 MeV or higher, the nuclear reaction cross section is relatively large. Therefore, the $^{12}$C existing in the region to the depth of 2.5 μm tends to cause the B-C reaction with the incident $^{11}$B ion. A large amount of carbon clearly exists on the graphite surface. The neutron ray may be generated from the region up to the depth of 2.5 μm of the graphite with a significant radiation dosage. Meanwhile, the energy of $^{11}$B ion is decreased to 3.5 MeV or lower in a region deeper than the depth of 4 μm. Therefore, even in a case the carbon exists in the region deeper than the depth of 4 μm, if the $^{11}$B ion has the incident energy of 7.5 Mev or less, the possibility that the B-C reaction occurs in the region deeper than the depth of 4 μm is sufficiently small, and thus, it can be ignored for practical use.

To secure safety in an operation of the ion implanter, it is desired that generation of the radioactive ray and generation of the radioactive nuclide are sufficiently suppressed. If some radioactive rays are generated and/or some radioactive nuclide are generated, it is desired for safety purposes to manage a radiation dosage of the radioactive ray and/or a generation amount of the radioactive nuclide. For example, it is expected that the radioactive ray is generated with a/relatively high radiation dosage and/or a relatively large amount of radioactive nuclide is generated in an ion beam irradiation condition where the incident energy is high and the ion beam current is high. In such a case, it is necessary to monitor and manage the radiation dosage of the radioactive ray and the generation amount of the radioactive nuclide with respect to the ion beam irradiation condition.

From this viewpoint, the present inventors devised several countermeasures to deal with the nuclear reaction caused by the ultrahigh energy ion implantation which may occur in the beamline of the ion implanter 100. Hereinafter, these countermeasures will be explained by taking the B-C reaction as an example.

A first countermeasure includes estimations of the radiation dosage of the generated radioactive ray and the generation amount of the generated radioactive nuclide. The estimated radiation dosage of the radioactive ray and the estimated generation amount of the radioactive nuclide can be used for a radiation dosage management of the radioactive ray. The ion implanter 100 may be configured to calculate at least one of the estimated radiation dosage of the radioactive rays and the estimated generation amount of the radioactive nuclide generated by the B-C reaction between the carbon existing in the irradiated region and the boron with which the irradiated region is irradiated. An appropriate warning may be displayed or output based on the estimated radiation dosage of the radioactive rays and/or the estimated generation amount of the radioactive nuclide. Since it is possible to urge the operator to take a necessary action by warning, safety in the operation of the ion implanter 100 can be enhanced.

An interlock with respect to the radiation dosage of the radioactive ray (for example, a neutron ray dosage) may be set. In a case where the radiation dosage of the radioactive ray is expected to exceed a set value, the ion implanter 100 may prohibit the following irradiation of the ion beam IB or may immediately stop the irradiation in the middle of the irradiation. Similarly, an interlock may be set to an accumulation amount of the radioactive nuclide in the irradiated region. In this way, an excessive occurrence of the radioactive ray is suppressed, and safety in operation of the ion implanter 100 can be enhanced.

A second countermeasure is a change of a material of the ion beam irradiated target. At least the irradiated region of the ion beam irradiated target is formed of a solid material containing an element having an atomic number (or atomic weight) larger than that of a material used typically in the related art. In this way, the irradiated region is formed of a material including the element which has the larger atomic number, and thus, the nuclear reaction become difficult to occur in the irradiated region. Even when the material contains an element having a smaller atomic number, the material can be adopted as long as the probability of occurrence of the nuclear reaction is reduced.

For example, with respect to the irradiated region formed of graphite in the related art, the material is changed from the graphite to a solid mixture or a solid compound of at least one element having an atomic number larger than that of carbon and the carbon, or a solid material which contains at least one element having an atomic number larger than that of carbon but does not contain carbon. In other words, the irradiated region may be formed of a material having a carbon concentration lower than that of graphite, or a non-carbon material. In this way, the irradiated region having a reduced number density of atoms or a reduced concentration of the carbon is formed. Therefore, even when the boron ion beam is incident into the irradiated region, the B-C reaction becomes difficult to occur.

A third countermeasure involves switching of the irradiated regions. A plurality of irradiated regions may be provided so as to be switchable in one ion beam irradiated target. The ion implanter 100 may be configured to select an irradiated region bringing a relatively small estimated radiation dosage of the radioactive ray from the plurality of switchable irradiated regions. The ion implanter 100 may be configured to select an irradiated region bringing a relatively small estimated generation amount of the radioactive nuclide from the plurality of switchable irradiated regions. If the ion beam IB is incident into the selected irradiated region, the excessive occurrence of the radioactive ray and/or the excessive accumulation of the radioactive nuclide is suppressed.

As a fourth countermeasure, the ion beam irradiated target includes a plurality of irradiated regions positioned at different locations, and the plurality of irradiated regions may include a high-energy-beam exclusive irradiated region allocated exclusively for a high energy ion beam accelerated to an energy exceeding a predetermined energy threshold value. The plurality of irradiated regions may include a low-energy-beam exclusive irradiated region allocated exclusively for a low energy ion beam accelerated to an energy of a predetermined energy threshold value or less. The ion implanter 100 may be configured to select an appropriate irradiated region from the plurality of irradiated regions according to the energy of the ion beam IB.

The low-energy-beam exclusive irradiated region may be formed of a first solid material and the high-energy-beam exclusive irradiated region may be formed of a second solid material different from the first solid material. The first solid material contains the second nonradioactive nuclide and the second solid material contains the second nonradioactive nuclide having a concentration lower than that of the first solid material or does not contain the second nonradioactive nuclide. Preferably, the second solid material includes an element having an atomic number larger than that of the second nonradioactive nuclide. In this way, the high-energy-beam exclusive region is formed of the material containing the element having a larger atomic number, and the nuclear reaction becomes difficult to occur in the high-energy-beam exclusive irradiated region. The nuclear reaction does not become a problem in the low-energy-beam exclusive irradiated region, and thus, the low-energy-beam exclusive irradiated region may be formed of an optional material.

As described with reference to FIG. 4, the ion beam IB has a high energy at a shallow region of the irradiated region. However, the energy is reduced as the ion beam IB moves forward to a deep region. As a result, at a deep position, the energy of the incident ion beam IB is lowered enough, and as can be shown in FIG. 3, it is considered that the nuclear reaction hardly occurs.

Therefore, with respect to at least the high-energy-beam exclusive irradiated region, different materials may be used for a shallow region and a deep region of the irradiated region. The ion beam irradiated target may include a base material and the irradiated region supported by the base material. The irradiated region may be a coating layer covering the base material. The base material may be formed of the first solid material and the irradiated region may be formed of the second solid material. In this way, the nuclear reaction becomes difficult to occur in the high-energy-beam exclusive irradiated region.

The countermeasures may be performed alone or in combination.

Figure 5:
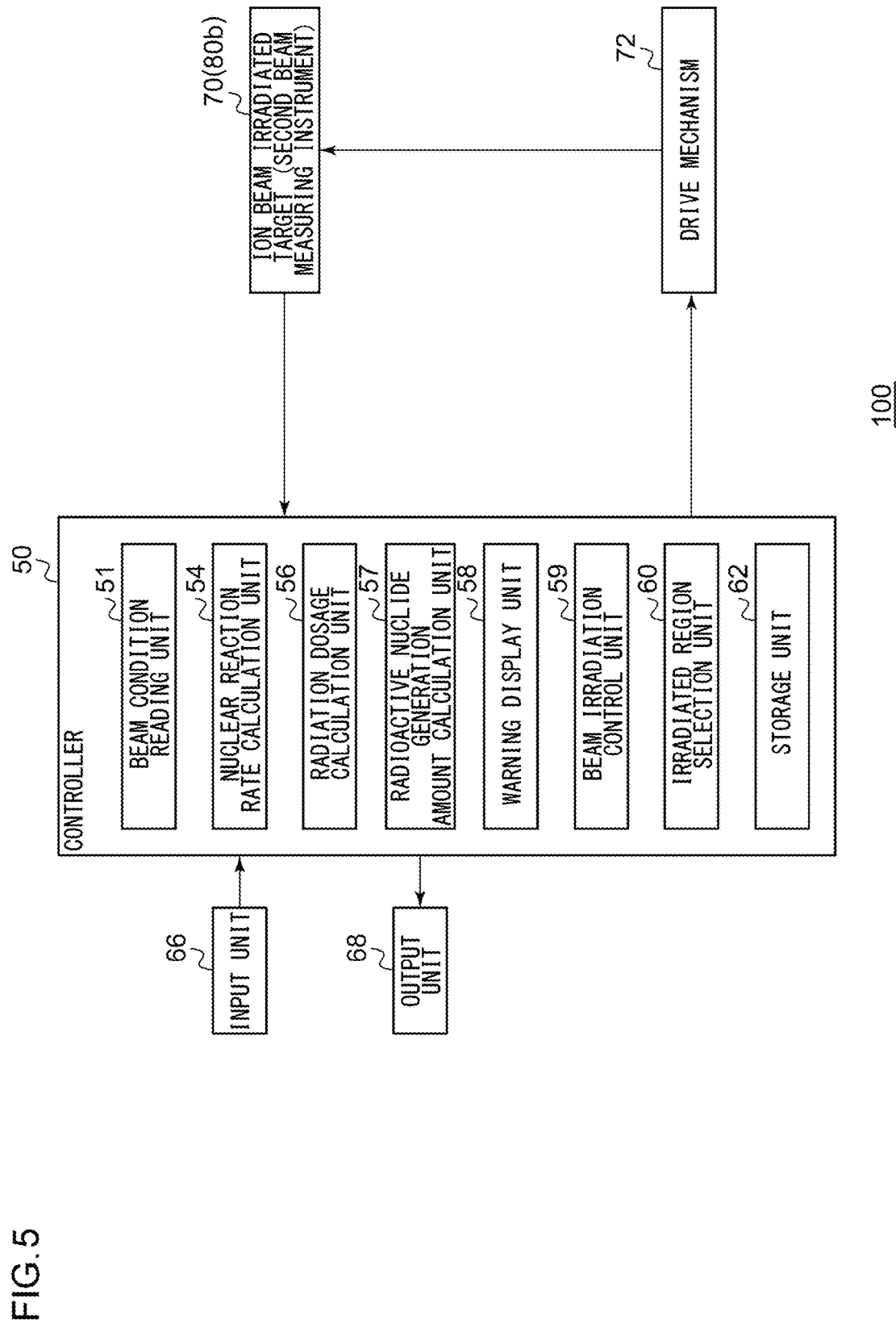
FIG. 5 is a block diagram showing a schematic configuration of a controller of the ion implanter according to the embodiment.

FIG. 5 is a block diagram showing a schematic configuration of a controller 50 of the ion implanter 100 according to the embodiment. A case in which the ion beam irradiated target 70 is the second beam measuring instrument 80b will be described as an example. The embodiment is also applicable in a case where the ion beam irradiated target 70 is the third beam measuring instrument 80c, another beam current measuring instrument, or another ion beam irradiated target.

Each block shown in a block diagram of the present specification can be realized by a mechanical device as a hardware configuration which includes chip or a circuit such as a CPU or a memory of a computer, and realized by a computer program or the like as a software configuration. Here, functional blocks realized by cooperation of them are shown. It is understood by a person skilled in the art that the functional blocks can be realized in various ways by a combination of hardware and software.

The controller 50 is configured to calculate the estimated radiation dosage of the neutron ray generated by the B-C reaction between the boron ion (for example, $^{11}$B ion or $^{10}$B ion) incident into the second beam measuring instrument 80b and a carbon atom (for example, $^{12}$C) contained in the beam detection surface of the second beam measuring instrument 80b. The controller 50 is configured to calculate the estimated generation amount of the $^{22}$Na which is the radioactive nuclide generated by the B-C reaction.

The controller 50 includes a beam condition reading unit 51, a nuclear reaction rate calculation unit 54, a radiation dosage calculation unit 56, radioactive nuclide generation amount calculation unit 57, a warning display unit 58, a beam irradiation control unit 59, an irradiated region selection unit 60, and a storage unit 62.

The controller 50 includes an input unit 66 and an output unit 68. The input unit 66 is configured to receive input from the operator or other apparatuses. For example, the input unit 66 includes input means such as a mouse or a keyboard for receiving an input from the operator and/or communication means for communicating with other apparatuses. The output unit 68 is configured to output data relating to the control of the ion implanter 100 and includes output means such as a display and a printer. The controller 50 can receive data input from the input unit 66 and/or can output data to the output unit 68.

A beam current measurement signal indicating an actually measured beam current which is measured by the second beam measuring instrument 80b is input to the controller 50. The controller 50 is configured to control a relative position adjustment mechanism configured to adjust a relative position between the ion beam irradiated target 70 and the ion beam IB such that the ion is incident into the selected irradiated region. For example, the relative position adjustment mechanism is a drive mechanism 72 configured to move the ion beam irradiated target 70 with respect to the ion beam IB.

The beam condition reading unit 51 reads the ion beam irradiation condition. For example, the ion beam irradiation condition includes a material of the irradiated region, an area of the irradiated region, the energy of the ion beam IB, an irradiation amount per unit time, an irradiation time, an implantation angle or the like. The ion beam irradiation condition is input from the input unit 66 by the operator or read from the storage unit 62.

The nuclear reaction rate calculation unit 54 calculates an estimated nuclear reaction rate of the B-C nuclear reaction in the ion beam irradiated target 70. The nuclear reaction rate indicates the number of occurrences of the nuclear reaction per unit time. The nuclear reaction rate calculation unit 54 can calculate the estimated nuclear reaction rate, based on the energy of the ion beam IB, the irradiation amount of the ions per unit time, and the number density of atom of the carbon atom (for example, $^{12}$C) in the irradiated region of the ion beam irradiated target 70. The nuclear reaction rate calculation unit 54 may calculate the estimated nuclear reaction rate by a known calculation method for calculating the nuclear reaction rate of the B-C reaction. The nuclear reaction rate calculation unit 54 stores the estimated nuclear reaction rate, in the storage unit 62.

The energy of the ion beam IB used for the calculation may be given as the energy decay curve determined according to the incident energy into the surface of the irradiated region and the material of the irradiated region. Alternatively, in order to decrease the calculation load, it may be assumed that an implantation depth of the ion beam IB is fixed (for example, 10 μm) based on an implantation projected range and the energy of the ion beam IB is a constant value (for example, a value equal to the incident energy into the surface of the irradiated region) in a depth direction. It is assumed that the energy in the deep region is higher than actually performed, and thus, the estimated radiation dosage of the radioactive ray and the estimated generation amount of the radioactive nuclide are calculated to be larger than actually generated. Accordingly, it is considered that the radiation dosage of the radioactive ray and the generation amount of the radioactive nuclide which are actually generated are less than the estimated radiation dosage and the estimated generation amount. This corresponds to taking a higher safety factor for estimation, which is safer for the operation of the ion implanter.

The irradiation amount per unit time used for the calculation may be an estimated value calculated from the ion beam irradiation condition. Alternatively, in order to improve the accuracy of estimation, the irradiation amount per unit time may be obtained from the actually measured beam current which is measured by the second beam measuring instrument 80b which is the ion beam irradiated target 70.

The radiation dosage calculation unit 56 calculates the estimated radiation dosage of the neutron ray, based on the estimated nuclear reaction rate calculated by the nuclear reaction rate calculation unit 54. The radiation dosage calculation unit 56 may calculate the estimated radiation dosage of the neutron ray by the known calculation method to calculate the radiation dosage of the neutron ray generated by the B-C reaction. The radiation dosage calculation unit 56 may calculate the estimated radiation dosage of the radioactive ray at a desired position outside of the beamline or the implanter 100, based on the estimated radiation dosage of the neutron ray, position information of the ion beam irradiated target 70 in the beamline, and disposition information of a radioactive ray shielding material provided in the periphery of the beamline. In this way, it is possible to monitor the estimated radiation dosage of the radioactive ray at an optional time. The radiation dosage calculation unit 56 stores the estimated radiation dosage of the neutron ray, in the storage unit 62. The estimated radiation dosage of the neutron ray may be output to the output unit 68.

The radioactive nuclide generation amount calculation unit 57 calculates the estimated generation amount of the $^{22}$Na, based on the estimated nuclear reaction rate calculated by the nuclear reaction rate calculation unit 54. The radioactive nuclide generation amount calculation unit 57 may calculate the estimated generation amount of the $^{22}$Na generated by the B-C reaction, by the known calculation method. The radioactive nuclide generation amount calculation unit 57 stores the estimated generation amount of the $^{22}$Na in the storage unit 62. The estimated generation amount of the $^{22}$Na may be output to the output unit 68.

The radioactive nuclide generation amount calculation unit 57 may calculate a cumulative estimated generation amount of radioactive nuclide accumulated in the ion beam irradiated target 70 by integrating the estimated generation amount of radioactive nuclide calculated for each ion beam irradiation condition. The radioactive nuclide can be generated and accumulated each time the irradiated region of the ion beam irradiated target 70 is irradiated with the ion beam according to the ion beam irradiation condition. The total amount of radioactive nuclides accumulated in the irradiated region as a result of repeated ion beam irradiation under various ion beam irradiation conditions is given by the accumulation of the generation amount of the radioactive nuclide generated under each ion beam irradiation condition. However, the accumulated amount of the radioactive nuclide decreases with time due to decay of the radioactive nuclide. Therefore, the radioactive nuclide generation amount calculation unit 57 may reflect a reduction amount of the radioactive nuclide due to the decay when integrating the estimated generation amount of the radioactive nuclide calculated for each ion beam irradiation condition.

The waring display unit 58 may determine whether or not the estimated radiation dosage of the neutron ray calculated by the radiation dosage calculation unit 56 exceeds a predetermined upper limit of the radiation dosage. The warning display unit 58 may determine whether or not the estimated generation amount (for example, the cumulative estimated generation amount) of the radioactive nuclide calculated by the radioactive nuclide generation amount calculation unit 57 exceeds a predetermined upper limit amount. The warning display unit 58 displays a warning in a case where the estimated radiation dosage of the neutron ray exceeds the predetermined upper limit of the radiation dosage and/or the estimated generation amount of the radioactive nuclide exceeds the predetermined upper limit amount. The warning may be output to the output unit 68. The warning may be a warning prompting an exchange of the ion beam irradiated target 70. The waring display unit 58 does not display a warning in a case where the estimated radiation dosage of the neutron ray does not exceed the predetermined upper limit of the radiation dosage and the estimated generation amount of the radioactive nuclide does not exceed the predetermined upper limit amount. For example, each of the predetermined upper limit of the radiation dosage and the predetermined upper limit amount can be appropriately set based on empirical or experimental findings.

The beam irradiation control unit 59 may determine whether or not the estimated radiation dosage of the neutron ray calculated by the radiation dosage calculation unit 56 exceeds the predetermined upper limit radiation dosage. The beam irradiation control unit 59 may determine whether or not the estimated generation amount (for example, the cumulative estimated generation amount) of the radioactive nuclide calculated by the radioactive nuclide generation amount calculation unit 57 exceeds the predetermined upper limit mount. The beam irradiation control unit 59 may prohibit the ion beam irradiated target 70 from being irradiated with the ion beam IB in a case where the estimated radiation dosage of the neutron ray exceeds the predetermined upper limit of the radiation dosage and/or the estimated generation amount of the radioactive nuclide exceeds the predetermined upper limit amount. If the ion beam irradiated target 70 is not currently irradiated with the ion beam IB, the beam irradiation control unit 59 may not allow the subsequent ion beam irradiation. In the middle of the ion beam irradiation, the beam irradiation control unit 59 may stop the ion beam irradiation. The beam irradiation control unit 59 may permit or continue the ion beam irradiation in a case where the estimated radiation dosage of the neutron radiation does not exceed the predetermined upper limit radiation dosage. The beam irradiation control unit 59 may permit or continue the irradiation of the ion beam in a case where the estimated generation amount of the radioactive nuclide does not exceed the predetermined upper limit amount. The upper limit of the radiation dosage and the upper limit amount for determining the prohibition of the ion beam irradiation may be the same as or different from the upper limit of the radiation dosage and the upper limit amount for warning, respectively.

For the ion beam irradiated target 70 having only a single irradiated region, in the case where the estimated radiation dosage of the neutron ray exceeds the predetermined upper limit of the radiation dosage and/or the estimated generation amount of the radioactive nuclide exceeds the predetermined upper limit amount, the beam irradiated target 70 may be exchanged with a new ion beam irradiated target 70 at an appropriate occasion such as the next maintenance work.

The ion beam irradiated target 70 may include a plurality of irradiated regions positioned at different locations. The irradiated region selection unit 60 may select an optional irradiation region from the plurality of irradiated regions of the ion beam irradiated target 70 such that the estimated radiation dosage of the neutron ray calculated by the radiation dosage calculation unit 56 is lower than the predetermined upper limit of the radiation dosage. The irradiated region selection unit 60 may select an optional irradiation region from the plurality of irradiated regions of the ion beam irradiated target 70 such that the estimated generation amount of the radioactive nuclide calculated by the radioactive nuclide generation amount calculation unit 57 is lower than the predetermined upper limit amount. The irradiated region selection unit 60 may control the drive mechanism 72 to move the ion beam irradiated target 70 with respect to the ion beam IB such that the ion is incident into the selected irradiated region.

The irradiated region selection unit 60 may newly select a different irradiated region each time the ion beam irradiation condition is changed. The irradiated region selection unit 60 may newly select the different irradiated regions in a case where the estimated radiation dosage of the neutron ray for the selected irradiated region exceeds the predetermined upper limit of the radiation dosage and/or the estimated generation amount of the radioactive nuclide for the selected irradiated region exceeds the predetermined upper limit amount.

The ion implanter 100 may include an ion beam deflection mechanism configured to deflect the ion beam IB such that the selected irradiated region is irradiated with the ion beam IB, as an example of the relative position adjustment mechanism.

FIGS. 6A to 6C are schematic views showing a switching structures having the plurality of irradiated regions 74 provided in the ion beam irradiated target 70. FIG. 6A shows the second beam measuring instrument 80b and FIGS. 6B and 6C show an aperture plate 82.

As shown in FIG. 6A, the second beam measuring instrument 80b includes four irradiated regions 74 arranged in two rows and two columns on one side of a plate-shaped member. Each irradiated region 74 is a faraday cup. The drive mechanism 72 can move the second beam measuring instrument 80b in horizontal and vertical directions on a plane in which the irradiated regions 74 are disposed, and can move the second beam measuring instrument 80b such that the ion beam IB (not shown) is incident into an optional irradiated region 74. The ion beam IB is incident into the second beam measuring instrument 80b in a direction perpendicular to the paper surface.

It is not essential for the irradiated region 74 and the faraday cup to correspond one to one. The plurality of irradiated regions 74 may be provided in one faraday cup. That is, an area of the beam detection surface of the faraday cup may be used as one irradiated region 74 and another area which does not overlap the area may be used as another irradiated region 74. Alternatively, the plurality of faraday cups may be provided in one irradiated region 74.

As shown in FIG. 6B, the aperture plate 82 has two slits 83 extending in parallel to each other, and one irradiated region 74 is arranged for each slit 83. The irradiated region 74 and the slit 83 may correspond one to one or may not correspond one to one. As shown in FIG. 6C, the plurality of irradiated regions 74 may be disposed so as not to overlap each other along one slit 83. For example, an upper portion in the vicinity of the slit 83 may be used as one irradiated region 74, and a lower portion in the vicinity of the slit 83 may be used as another irradiated region 74 so as not to overlap the irradiated region 74 of the upper portion.

Various methods are possible for the disposition of the plurality of irradiated regions 74 and the movement of the ion beam irradiated target 70. Several examples are shown in FIG. 7A to 7D.

Figure 7A:
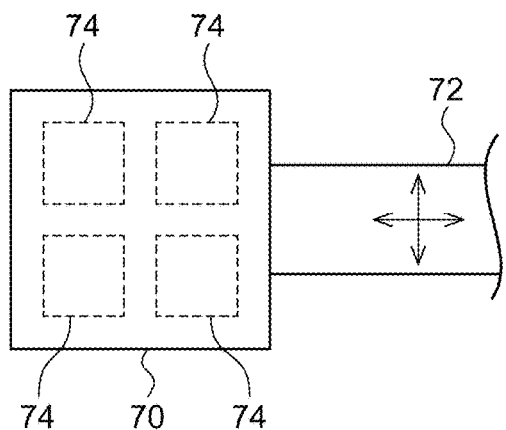
FIGS. 7A to 7D are schematic views each of which shows the switching structure having the plurality of irradiated regions provided in the ion beam irradiated target.
Figure 7B:
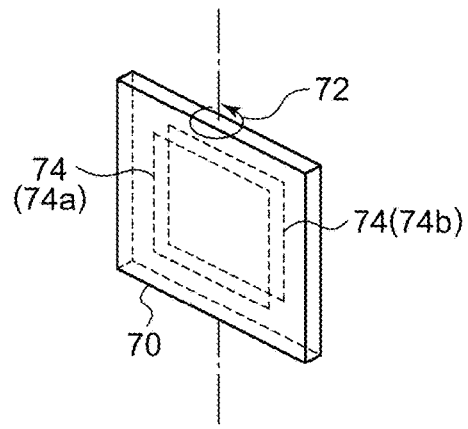

As shown in FIG. 7A, the ion beam irradiated target 70 may have a planar shape, the plurality of irradiated regions 74 may be arranged on the plane, and the drive mechanism 72 may move the ion beam irradiated target 70 in a direction parallel to the plane such that the irradiated regions 74 are switched. The plurality of irradiated regions 74 may be arranged in a line and the drive mechanism 72 may move the ion beam irradiated target 70 along the arrangement direction of the irradiated regions 74. As shown in FIG. 7B, the plurality of irradiated regions 74 may be disposed on a front and back surfaces of a plate, and the drive mechanism 72 may invert the ion beam irradiated target 70 such that the ion beam irradiated regions 74 are switched.

Figure 7C:
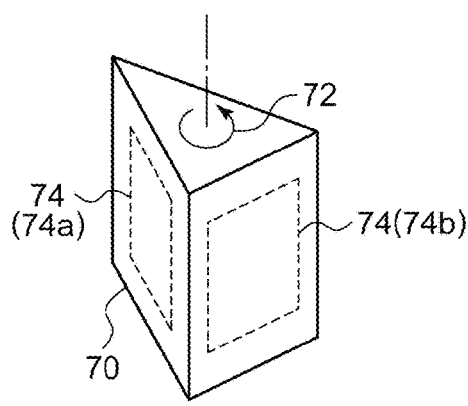

As shown in FIG. 7C, the ion beam irradiated target 70 may have a prismatic shape (for example, a triangular prism shape or a quadrangular prism shape), the plurality of irradiated regions 74 may be disposed on the side surfaces of the prism, the drive mechanism 72 may rotate the ion beam irradiated target 70 around a central axis of the prism or an axis parallel to the central axis of the prism such that the irradiated regions 74 are switched. The irradiated regions 74 may be disposed one by one on each side surface of the prism, or the plurality of irradiated regions 74 may be disposed on each side surface of the prism. In a case where the plurality of irradiated regions 74 are disposed on one side surface, the drive mechanism 72 may move the ion beam irradiated target 70 in a direction parallel to the side surface such that the irradiated regions 74 are switched.

Figure 7D:
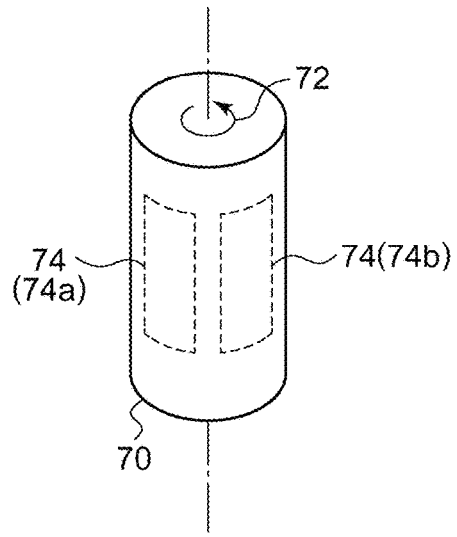

As shown in FIG. 7D, the ion beam irradiated target 70 may have a cylindrical shape, the plurality of irradiated regions 74 may be disposed at different angular positions on the side surface of the cylinder, and the drive mechanism 72 may rotate the ion beam irradiated target 70 around a central axis of the cylinder or an axis parallel to the central axis of the cylinder such that the irradiated regions 74 are switched. The irradiated regions 74 may be disposed one by one at different angular positions of the cylinder or the plurality of irradiated regions 74 may be disposed at the same angular position of the cylinder. The drive mechanism 72 may move the ion beam irradiated target 70 in the direction of the central axis such that the irradiated regions 74 are switched.

Figure 8A:
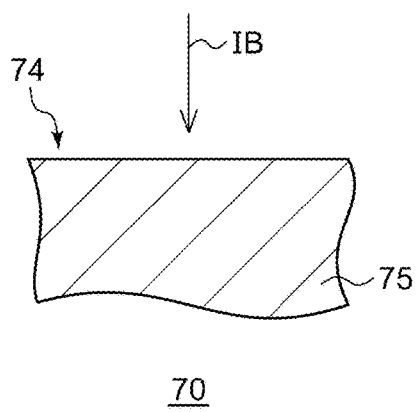
FIGS. 8A and 8B are schematic views showing examples of the irradiated regions of the ion beam irradiated targets.
Figure 8B:
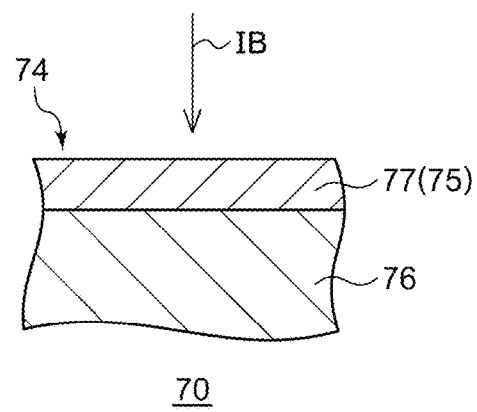

FIGS. 8A and 8B are schematic views showing examples of the irradiated region 74 on the ion beam irradiated target 70. As shown in FIG. 8A, the irradiated region 74 is formed of a solid material 75. The solid material 75 includes carbon and at least one element having an atomic number larger than that of carbon. Alternatively, the solid material 75 consists of only one element having the atomic number larger than that of carbon (in this case, the solid material 75 does not contain carbon). For example, the element having the atomic number larger than that of carbon is aluminum (Al), silicon (Si), molybdenum (Mo), tantalum (Ta), or tungsten (W). The solid material 75 may be a solid mixture or a solid compound of carbon and at least one element having the atomic number larger than that of carbon. For example, the solid material 75 may be a mixture of carbon (for example, graphite) and aluminum. The solid material 75 may be SiC or $Si_xC_y$ (x and y indicate composition ratios). In this way, the irradiated region 74 is formed in which the number density of atoms or the concentration of carbon is reduced in comparison with a typical graphite irradiated region of the related art. Therefore, even when the ion beam IB of boron is incident into the irradiated region 74, the B-C reaction becomes difficult to occur.

As shown in FIG. 8B, the ion beam irradiated target 70 includes a base material 76 and a surface layer portion 77 supported by the base material 76. The surface layer part 77 is formed on the base material 76. The surface layer portion 77 may be a coating layer covering the base material 76. For example, the surface layer portion 77 may be formed on a surface of the base material 76 by a suitable film forming method such as vapor deposition. An exposed surface of the surface layer portion 77 is used as the irradiated region 74.

The base material 76 is formed of graphite or other suitable solid materials. The base material 76 may be formed of only graphite. The surface layer portion 77 is formed of the above-described solid material 75. That is, the surface layer portion 77 is formed of the solid material containing carbon and at least one element having the atomic number larger than that of carbon, or the solid material composed of only one element having the atomic number larger than that of carbon. In this way, after the energy of the ion beam IB which is incident into the irradiated region 74 is attenuated in the surface layer portion 77, the ion beam IB penetrates a deep portion of the base material 76. In the surface layer portion 77, the number density of atoms or the concentration of carbon is reduced in comparison with the typical graphite irradiated region in the related art. Therefore, even when the ion beam IB containing boron is incident into the irradiated region 74, the B-C reaction becomes difficult to occur.

Figure 9:
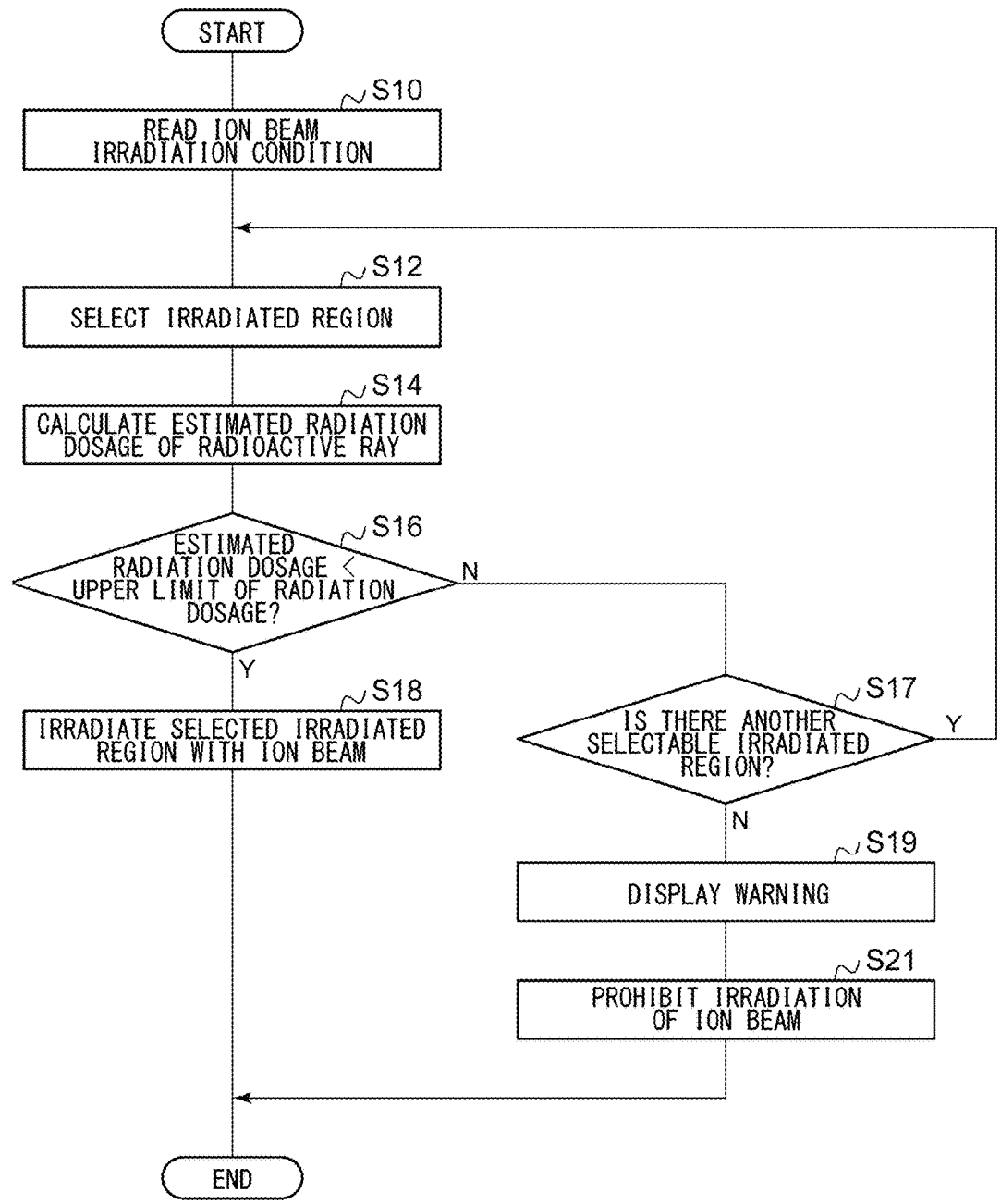
FIG. 9 is a flowchart showing a switching process of the irradiated regions of the ion beam irradiated target according to the embodiment.

FIG. 9 is a flowchart showing a switching processing of the irradiated region 74 of the ion beam irradiated target 70 according to the embodiment. This processing is performed by the controller 50. If the processing starts, first, the ion beam irradiation condition is read into the beam condition reading unit 51 of the controller 50 (S10). For example, the read ion beam irradiation condition is an ion beam irradiation condition used for the next irradiation. Alternatively, for example, for calculation of the radiation dosage of the radioactive ray, any other ion beam irradiation condition may be read into the controller 50.

The irradiated region 74 is selected (S12). The irradiated region selection unit 60 may select the irradiated region 74 selected in the previous processing as it is. Alternatively, the irradiated region selection unit 60 may newly select another irradiated region 74.

The estimated radiation dosage of the radioactive ray is calculated (S14). As described with reference to FIG. 5, the controller 50 calculates the estimated radiation dosage of the radioactive ray generated from the selected irradiated region 74, based on the read ion beam irradiation condition and the material of the selected irradiated region 74.

The irradiated region selection unit 60 determines whether or not the estimated radiation dosage of the calculated radioactive ray exceeds the predetermined upper limit radiation dosage (S16). In a case where the estimated radiation dosage of the calculated radioactive ray exceeds the predetermined upper limit radiation dosage (N in S16), it is determined whether or not there is another selectable irradiated region 74 (S17). In a case where there is another selectable irradiated region 74 (Y in S17), the irradiated region selection unit 60 selects another irradiated region 74 (S12). Here, the irradiated region selection unit 60 selects the irradiated region 74 for which the estimated radiation dosage of the radioactive ray has not been determined to exceed the predetermined upper limit radiation dosage. The irradiated region 74 in which the estimated radiation dosage of the radioactive ray has been determined to exceed the predetermined upper limit radiation dosage in past processing is not selected. For the selected irradiated region 74, the estimated radiation dosage of the radioactive ray is calculated (S14) and it is reconfirmed whether or not the estimated radiation dosage of the calculated radioactive ray exceeds the predetermined upper limit radiation dosage (S16).

In a case where there is not the another selectable irradiated region 74 (N in S17), the controller 50 displays the warning (S19) and prohibits the ion beam irradiation to the ion beam irradiated target 70 (S21).

In a case where the estimated radiation dosage of the radioactive ray does not exceed the predetermined upper limit of the radiation dosage (Y in S16), the selected irradiated region 74 is irradiated with the ion beam IB (S18). The relative position between the ion beam irradiated target 70 and the ion beam IB is adjusted such that the ion is incident into the selected irradiated region 74, and the ion beam irradiated target 70 is supported by the beamline at the position. The ion beam IB is generated by the ion source 10 and is accelerated by the high energy multistage linear acceleration unit 14. The ion beam IB is transported by the beamline in the downstream side of the high energy multistage linear acceleration unit 14, and the ion beam irradiated target 70 is irradiated with the ion beam IB. In this way, the process ends.

FIG. 10 is a flowchart showing another switching process of the irradiated region 74 of the ion beam irradiated target 70 according to the embodiment. This process is performed by the controller 50. If the process starts, first, the ion beam irradiation condition is read into the beam condition reading unit 51 of the controller 50 (S10). Next, the irradiated region 74 is selected (S12).

The estimated generation amount of the radioactive nuclide is calculated (S20). As described with reference to FIG. 5, the controller 50 calculates the estimated generation amount of the radioactive nuclide in the selected irradiated region 74, based on the read ion beam irradiation condition and the material of the selected irradiated region 74.

The irradiated region selection unit 60 determines whether or not the estimated generation amount of the radioactive nuclide exceeds the predetermined upper limit amount (S22). In a case where the estimated generation amount of the radioactive nuclide exceeds the predetermined upper limit amount (N in S22), it is determined whether or not there is another selectable irradiated region 74 (S17). In a case where there is the another selectable irradiated region 74 (Y in S17), the irradiated region selection unit 60 selects the another irradiated region 74 (S12). Here, the irradiated region selection unit 60 selects the irradiated region 74 for which the estimated generation amount of the radioactive nuclide has been determined not to exceed the predetermined upper limit amount. The irradiated region 74 for which the estimated generation amount of the radioactive nuclide has been determined to exceed the predetermined upper limit amount in past process is not selected. For the selected irradiated region 74, the estimated generation amount of the radioactive nuclide is calculated (S20) and it is determined again whether or not the estimated generation amount of the radioactive nuclide exceeds the predetermined upper limit amount (S22).

In the case where there is not the another selectable irradiated region 74 (N in S17), the controller 50 displays the warning (S19) and prohibits the ion beam irradiation to the ion beam irradiated target 70 (S21).

In a case where the estimated generated amount of the radioactive nuclide does not exceed the predetermined upper limit amount (Y in S22), the selected irradiated region 74 is irradiated with the ion beam IB (S24). The relative position between the ion beam irradiated target 70 and the ion beam IB is adjusted such that the ion is incident into the selected irradiated region 74, and the ion beam irradiated target 70 is supported by the beamline at the position. The ion beam IB is generated by the ion source 10 and is accelerated by the high energy multistage linear acceleration unit 14. The ion beam IB is transported by the beamline in the downstream side of the high energy multistage linear acceleration unit 14, and the ion beam irradiated target 70 is irradiated with the ion beam IB.

After the ion beam irradiated target 70 is irradiated with the ion beam IB, the estimated generation amount of the radioactive nuclide in the selected irradiated region 74 is updated (S26). The radioactive nuclide generation amount calculation unit 57 integrates the estimated generation amount of the radioactive nuclide due to the present irradiation of the ion beam IB with the existing estimated generation amount. The updated estimated generation amount of the radioactive nuclide is saved in the storage unit 62, and the present process ends.

Figure 11A:
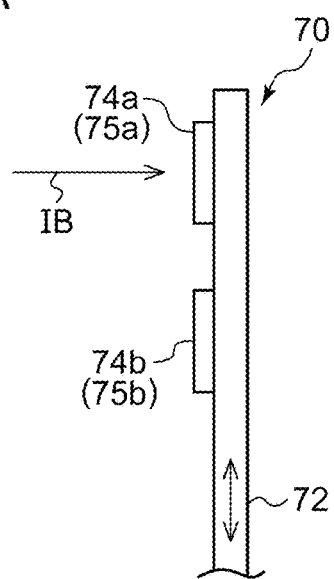
FIG. 11A to FIG. 11C are schematic views showing other examples of the ion beam irradiated targets.
Figure 11B:
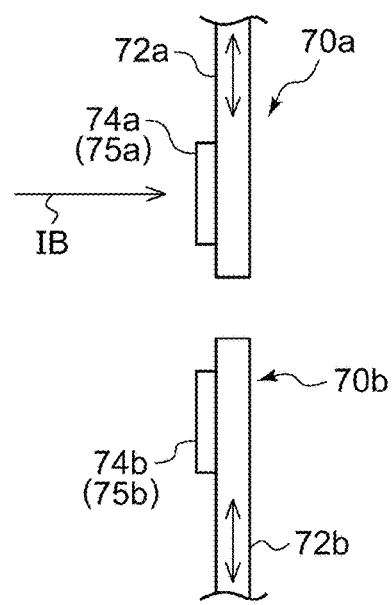
Figure 11C:
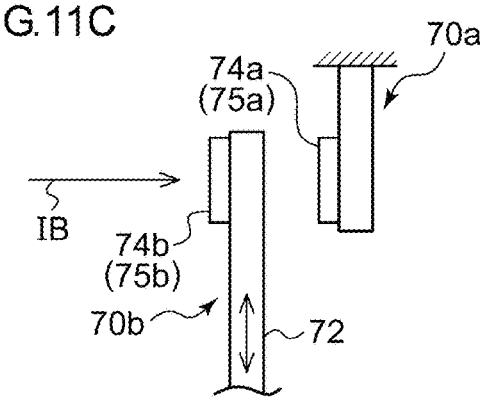

FIGS. 11A to 11C are schematic views showing other examples of the ion beam irradiated targets 70. As shown in FIG. 11A, the ion beam irradiated target 70 includes a first irradiated region 74*a* and a second irradiated region 74*b* which are disposed in a driving direction by the drive mechanism 72. Accordingly, the ion beam irradiated target 70 can select the irradiated region irradiated with the ion beam IB from the first irradiated region 74*a* and the second irradiated region 74b, by driving the drive mechanism 72. The ion beam irradiated target 70 may be the second beam measuring instrument 80b or other beam current measuring instruments. The first irradiated region 74a and the second irradiated region 74b may be faraday cups, respectively. The ion beam irradiated target 70 may be other ion beam irradiated targets.

The ion beams IB accelerated to different energies are incident into the first irradiated region 74a and the second irradiated region 74b, respectively. The first irradiated region 74a is allocated for the ion beam accelerated to the first energy range and the second irradiated region 74b is allocated for the ion beam accelerated to the second energy range.

The second energy range is higher than the first energy range. For example, the second energy range is in an ultrahigh energy region of 4 MeV or higher, or 5 MeV or higher. In other words, a value of a lower energy limit of the second energy range is selected in the ultrahigh energy region of 4 MeV or higher, or 5 MeV or higher. For example, the first energy range is in the energy region lower than 4 MeV, or lower than 5 MeV. A value of an upper energy limit of the first energy range is selected in the energy region lower than 4 MeV, or lower than 5 MeV. For example, the first energy range and second energy range can be appropriately set based on empirical or experimental findings.

If necessary, a third irradiated region allocated for the ion beam accelerated to a third energy range higher than the second energy range may be provided in the ion beam irradiated target 70.

In the example shown in FIG. 11A, the ion beam irradiated target 70 includes one first irradiated region 74a and one second irradiated region 74b. However, the ion beam irradiated target 70 may include a plurality of first irradiated regions 74a and a plurality of second irradiated regions 74b. The ion beams having different energies may be allocated to the plurality of first irradiated regions 74a (or the plurality of second irradiated regions 74b), respectively. Alternatively, similarly to FIGS. 6A to 6C, the plurality of first irradiated regions 74a (or the plurality of second irradiated region 74b) may be switchable independently of the energy.

As shown in FIG. 7B, the ion beam irradiated target 70 may have a planar shape, the first irradiated region 74a may be disposed on the front surface of the ion beam irradiated target 70, and the second irradiated region 74b may be disposed on the rear surface of the ion beam irradiated target 70. The drive mechanism 72 may invert the ion beam irradiated target 70 such that the first irradiated region 74a and the second irradiated region 74b are switched.

As shown in FIG. 7C, the ion beam irradiated target 70 may have a prismatic shape, the first irradiated region 74a may be disposed on one side surface of the prism, and the second irradiated region 74b may be disposed on another side surface of the prism. The drive mechanism 72 may rotate the ion beam irradiated target 70 around the central axis of the prism or an axis parallel to the central axis of the prism such that the first irradiated region 74a and the second irradiated region 74b are switched. As shown in FIG. 7D, the ion beam irradiated target 70 may have a cylindrical shape, the first irradiated region 74a may be disposed at an angular position on the side surface of the cylinder, and the second irradiated region 74b may be disposed at another angular position on the side surface of the cylinder. The drive mechanism 72 may rotate the ion beam irradiated target 70 around the central axis of the cylinder or an axis parallel to the central axis such that the first irradiated region 74a and the second irradiated region 74b are switched.

As shown in FIG. 11B, a first ion beam irradiated target 70a having the first irradiated region 74a and a second ion beam irradiated target 70b having the second irradiated region 74b may be provided. The first ion beam irradiated target 70a and the second ion beam irradiated target 70b may be movable such that the first irradiated region 74a and the second irradiated region 74b are switched. The first ion beam irradiated target 70a may be driven by a first drive mechanism 72a and the second ion beam irradiated target 70b may be driven by a second drive mechanism 72b.

As shown in FIG. 11C, one of the first ion beam irradiated target 70a and the second ion beam irradiated target 70b may be fixed, and the other thereof may be made movable by the drive mechanism 72. The first ion beam irradiated target 70a (or the second ion beam irradiated target 70b) may be fixed and the second ion beam irradiated target 70b (or the first ion beam irradiated target 70a) may be movable forward and backward with respect to a path of the ion beam IB in front of the first irradiated region 74a (or the second irradiated region 74b).

A plurality of irradiated regions 74 of the ion beam irradiated target 70 may be allocated according to the ion species. For example, the ion beam irradiated target 70 may include an irradiated region for the boron ion and another irradiated region for other ion species. As the irradiated regions for the boron ion, the first irradiated region 74a and the second irradiated region 74b described above may be provided. Alternatively, the first irradiated region 74a may be allocated to a low energy ion beam including the boron ion and ion beams of other ion species and the second irradiated region 74b may be allocated to a high energy ion beam including the boron ion.

The first irradiated region 74a is formed of the first solid material 75a. The first solid material 75a may be graphite and the first irradiated region 74a may be formed of only graphite. The first solid material 75a may be other suitable solid materials.

The second irradiated region 74b is formed of the second solid material 75b. The second solid material 75b includes carbon and at least one element having the atomic number larger than that of carbon. Alternatively, the second solid material 75b consists of only one element having the atomic number larger than that of carbon (in this case, the second solid material 75b does not contain carbon). For example, the element having an atomic number larger than that of carbon is aluminum (Al), silicon (Si), molybdenum (Mo), tantalum (Ta), or tungsten (W). The second solid material 75b may be a solid mixture or a solid compound of carbon and at least one element having the atomic number larger than that of carbon. For example, the second solid material 75b may be a mixture of carbon (for example, graphite) and aluminum. The second solid material 75b may be SiC or $Si_xC_y$ (x and y indicate composition ratios). In this way, the second irradiated region 74b is formed in which the number density of atoms or the concentration of carbon is reduced in comparison with the typical graphite irradiated region in the related art. Therefore, even when the ion beam IB of boron is incident into the second irradiated region 74b, the B-C reaction becomes difficult to occur.

Similarly to the irradiated region 74 shown in FIG. 8B, the second irradiated region 74b includes the base material and the surface layer portion supported by the base material. The base material may be formed of the first solid material 75a and the surface layer portion may be formed of the second solid material 75b.

Figure 12:
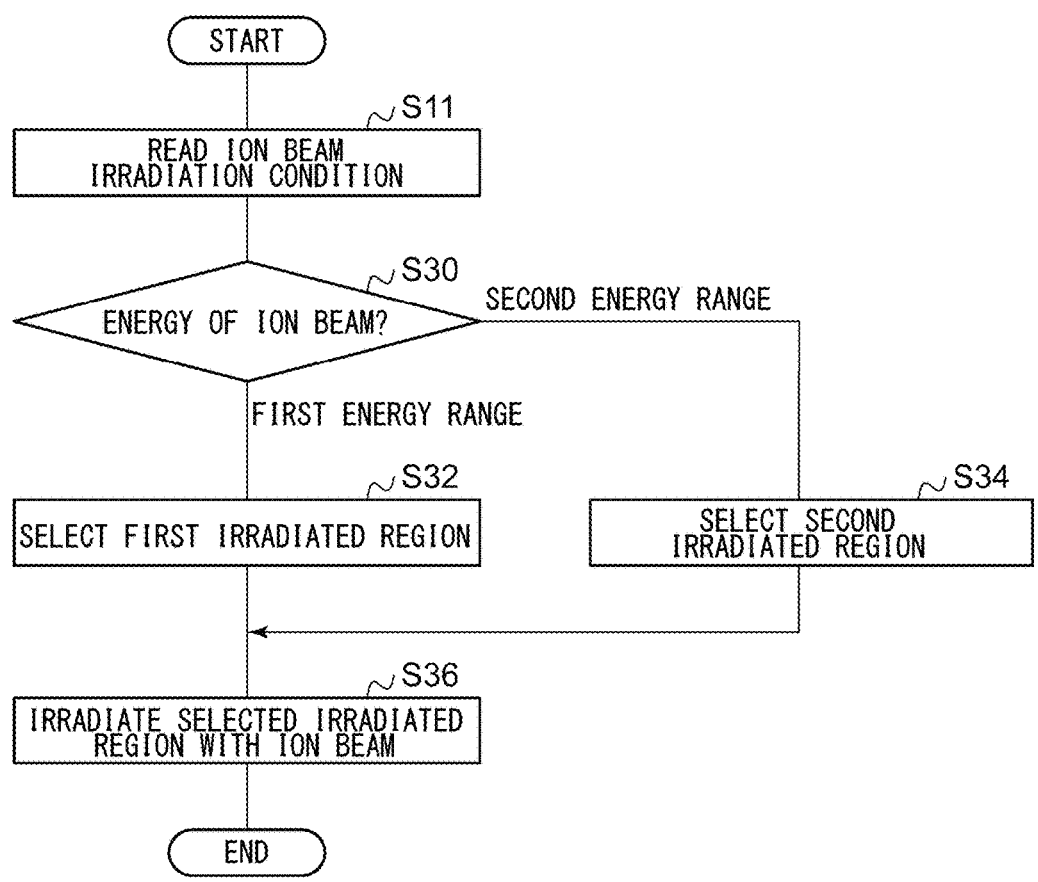
FIG. 12 is a flowchart showing still another switching process of the irradiated regions of the ion beam irradiated target according to the embodiment.

FIG. 12 is a flowchart showing another switching process of the irradiated region 74 of the ion beam irradiated target 70 according to the embodiment. This process is performed by the controller 50. If the process starts, first, the ion beam irradiation condition is read into the beam condition reading unit 51 of the controller 50 (S11).

Next, the determination of the ion beam irradiation condition is performed. The irradiated region selection unit 60 determines whether or not the energy of the ion beam incident into the ion beam irradiated target 70 is in the first energy range or in the second energy range (S30). In a case where the energy of the ion beam incident into the ion beam irradiated target 70 is in the first energy range, the irradiated region selection unit 60 selects the first irradiated region 74a (S32). In a case where the energy of the ion beam incident into the ion beam irradiated target 70 is in the second energy range, the irradiated region selection unit 60 selects the second irradiated region 74b (S34). Thereafter, the selected irradiated region 74 is irradiated with the ion beam IB (S36). In this way, the present process ends.

The irradiated region selection unit 60 may determine whether or not the ion beam incident into the ion beam irradiated target 70 is an ion beam containing the boron ion. The irradiated region selection unit 60 may select the first irradiated region 74a in the case where the energy of the boron ion beam is in the first irradiated region. The irradiated region selection unit 60 may select the second irradiated region 74b in the case where the energy of the boron ion beam is in the second energy range. The irradiated region selection unit 60 may select the first irradiated region 74a in the case where the ion beam does not contain the boron ion.

By switching the irradiated regions according to the energy and the ion species of the ion beam, occurrence of the B-C nuclear reaction is suppressed. Therefore, the radiation dosage of the radioactive ray generated from the ion beam irradiated target 70 when the ultrahigh energy ion is incident decreases or is substantially eliminated. The generation amount of the radioactive nuclide also decreases or is substantially eliminated. Accordingly, the controller 50 may not calculate the estimated radiation dosage of the radioactive ray and the estimated generation amount of the radioactive nuclide for the first irradiated region 74a and the second irradiated region 74b. Alternatively, to ensure that the radiation dosage of the radioactive ray and the estimated generation amount of the radioactive nuclide are sufficiently low, the controller 50 may calculate the estimated radiation dosage of the radioactive ray and the estimated generation amount of the radioactive nuclide for only the second irradiated region 74b.

It should be understood that the invention is not limited to the above-described embodiment, but may be modified into various forms on the basis of the spirit of the invention. Additionally, the modifications are included in the scope of the invention.

Hereinbefore, the B-C reaction with respect to the incidence of $^{11}$B is described. However, a similar nuclear reaction may also occur with respect to the incidence of $^{10}$B, which is a stable isotope of boron. A nuclear reaction between 10B and 12C is represented by the following Expression.

$$^{10}B + ^{12}C \rightarrow ^{21}Na + n + k\gamma$$

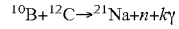

Also for the incidence of $^{10}$B, a method similar to that for the incidence of $^{11}$B can be applied.

Embodiments of the present invention can be described as follows.

1. An ion implanter, including: an ion source configured to generate an ion beam including an ion of a first nonradioactive nuclide; a beamline configured to support an ion beam irradiated target formed of a solid material including a second nonradioactive nuclide different from the first nonradioactive nuclide; and a controller configured to calculate at least one of an estimated radiation dosage of a radioactive ray and an estimated generation amount of a radioactive nuclide generated by a nuclear reaction between the first nonradioactive nuclide and the second nonradioactive nuclide.

2. The ion implanter according to 1, wherein the first nonradioactive nuclide is $^{11}$B or $^{10}$B, the second nonradioactive nuclide is $^{12}$C, the generated radioactive ray is a neutron ray, and the generated radioactive nuclide is $^{22}$Na or $^{21}$Na.

3. The ion implanter according to 1 or 2, further including: an accelerator which can accelerate the ion beam generated by the ion source to an ultrahigh energy higher than or equal to at least 4 MeV.

4. The ion implanter according to any one of 1 to 3, wherein the controller includes a nuclear reaction rate calculator which calculates an estimated nuclear reaction rate based on an ion beam irradiation condition including an energy of the ion beam and an irradiation amount of the ion beam per unit time and based on a number density of atoms of the second nonradioactive nuclide in an irradiated region of the ion beam irradiated target, and a radiation dosage calculator which calculates the estimated radiation dosage of the generated radioactive ray based on the estimated nuclear reaction rate.

5. The ion implanter according to 4, wherein the controller includes a radioactive nuclide generation amount calculator which calculates the estimated generation amount of the generated radioactive nuclide based on the estimated nuclear reaction rate.

6. The ion implanter according to any one of 1 to 5, wherein the controller is configured to display a warning and/or to prohibit irradiation of the ion beam to the ion beam irradiated target in a case where the estimated radiation dosage of the generated radioactive ray exceeds a predetermined upper limit of the radiation dosage and/or in a case where the estimated generation amount of the generated radioactive nuclide exceeds a predetermined upper limit amount.

7. The ion implanter according to any one of 1 to 6, wherein the ion beam irradiated target includes a base material and an irradiated region which is supported by the base material and the irradiated region is formed of a solid material including an element having an atomic number larger than that of the second nonradioactive nuclide.

8. The ion implanter according to any one of 1 to 7, wherein the ion beam irradiated target includes a plurality of irradiated regions which are positioned at locations different from each other, wherein the controller is configured to select any one of the plurality of irradiated regions such that the estimated radiation dosage of the generated radioactive ray becomes less than a predetermined upper limit of the radiation dosage, and wherein the beamline includes a relative position adjustment mechanism configured to adjust a relative position between the ion beam irradiated target and the ion beam such that the ion of the first nonradioactive nuclide is incident into the selected irradiated region.

9. The ion implanter according to any one of 1 to 8, wherein the ion beam irradiated target includes a plurality of irradiated regions which are positioned at locations different from each other, wherein the controller is configured to select any one of the plurality of irradiated regions such that the estimated generation amount of the generated radioactive nuclide becomes less than a predetermined upper limit amount, and wherein the beamline includes a relative position adjustment mechanism configured to adjust a relative position between the ion beam irradiated target and the ion beam such that the ion of the first nonradioactive nuclide is incident into the selected irradiated region.

10. The ion implanter according to any one of 1 to 7, wherein the ion beam irradiated target includes a first irradiated region which is formed of a first solid material including the second nonradioactive nuclide and a second irradiated region which is formed of a second solid material which includes the second nonradioactive nuclide with a concentration lower than that of the first solid material or does not include the second nonradioactive nuclide, wherein the controller is configured to select the first irradiated region in a case where an energy of the ion beam is in a first energy range and to select the second irradiated region in a case where the energy of the ion beam is in a second energy range higher than that of the first energy range, and wherein the beamline includes a relative position adjustment mechanism configured to adjust a relative position between the ion beam irradiated target and the ion beam such that the ion of the first nonradioactive nuclide is incident into the selected irradiated region.

11. The ion implanter according to claim 10, wherein the second solid material includes an element having an atomic number larger than that of the second nonradioactive nuclide.

12. The ion implanter according to claim 10 or 11, wherein the second energy range is an ultrahigh energy range higher than or equal to 4 MeV.

13. The ion implanter according to any one 1 to 12, wherein the ion beam irradiated target is configured as a beam current measuring instrument provided in the beamline, and wherein the controller calculates at least one of the estimated radiation dosage of the generated radioactive ray and the estimated generation amount of the generated radioactive nuclide based on an actually measured beam current which is measured by the beam current measuring instrument.

14. The ion implanter according to any one of 1 to 13, wherein the ion beam irradiated target is configured to be at least apart of either one of the following: a beam deflection unit, an aperture plate, a beam shutter, a beam damper, a wafer support portion, or a wafer.

15. An ion implanter, including: an ion source configured to generate an ion beam including an ion of a first nonradioactive nuclide; a beamline configured to support anion beam irradiated target including a first irradiated region and a second irradiated region; and a controller configured to select the first irradiated region in a case where an energy of the ion beam is in a first energy range and to select the second irradiated region in a case where the energy of the ion beam is in a second energy range higher than that of the first energy range, wherein the beamline includes a relative position adjustment mechanism configured to adjust a relative position between the ion beam irradiated target and the ion beam such that the ion of the first nonradioactive nuclide is incident into the selected irradiated region, wherein the first irradiated region is formed of a first solid material including a second nonradioactive nuclide different from the first nonradioactive nuclide, and wherein the second irradiated region is formed of a second solid material which includes the second nonradioactive nuclide with a concentration lower than that of the first solid material or does not include the second nonradioactive nuclide.

16. An ion implantation method, including: generating an ion beam including an ion of a first nonradioactive nuclide; supporting an ion beam irradiated target formed of a solid material including a second nonradioactive nuclide different from the first nonradioactive nuclide; and calculating at least one of an estimated radiation dosage of a radioactive ray and an estimated generation amount of a radioactive nuclide generated by a nuclear reaction between the first nonradioactive nuclide and the second nonradioactive nuclide.

What is claimed is:

1. An ion implanter, comprising:
an ion source configured to generate an ion beam including an ion of a first nonradioactive nuclide;
a beamline configured to support an ion beam irradiated target formed of a solid material including a second nonradioactive nuclide different from the first nonradioactive nuclide; and
a controller configured to calculate at least one of an estimated radiation dosage of a radioactive ray and an estimated generation amount of a radioactive nuclide generated by a nuclear reaction between the first nonradioactive nuclide and the second nonradioactive nuclide.

2. The ion implanter according to claim 1,
wherein the first nonradioactive nuclide is $^{11}$B or $^{10}$B, the second nonradioactive nuclide is $^{12}$C, the generated radioactive ray is a neutron ray, and the generated radioactive nuclide is $^{22}$Na or $^{21}$Na.

3. The ion implanter according to 1, further comprising:
an accelerator which can accelerate the ion beam generated by the ion source to an ultrahigh energy higher than or equal to at least 4 MeV.

4. The ion implanter according to claim 1,
wherein the controller includes
a nuclear reaction rate calculator which calculates an estimated nuclear reaction rate based on an ion beam irradiation condition including an energy of the ion beam and an irradiation amount of the ion beam per unit time and based on a number density of atoms of the second nonradioactive nuclide in an irradiated region of the ion beam irradiated target, and
a radiation dosage calculator which calculates the estimated radiation dosage of the generated radioactive ray based on the estimated nuclear reaction rate.

5. The ion implanter according to claim 4,
wherein the controller includes a radioactive nuclide generation amount calculator which calculates the estimated generation amount of the generated radioactive nuclide based on the estimated nuclear reaction rate.

6. The ion implanter according to claim 1,
wherein the controller is configured to display a warning and/or to prohibit irradiation of the ion beam to the ion beam irradiated target in a case where the estimated radiation dosage of the generated radioactive ray exceeds a predetermined upper limit of the radiation dosage and/or in a case where the estimated generation amount of the generated radioactive nuclide exceeds a predetermined upper limit amount.

7. The ion implanter according to claim 1,
wherein the ion beam irradiated target includes a base material and an irradiated region which is supported by the base material and the irradiated region is formed of a solid material including an element having an atomic number larger than that of the second nonradioactive nuclide.

8. The ion implanter according to claim 1,
wherein the ion beam irradiated target includes a plurality of irradiated regions which are positioned at locations different from each other, wherein the controller is configured to select anyone of the plurality of irradiated regions such that the estimated radiation dosage of the generated radioactive ray becomes less than a predetermined upper limit of the radiation dosage, and wherein the beamline includes a relative position adjustment mechanism configured to adjust a relative position between the ion beam irradiated target and the ion beam such that the ion of the first nonradioactive nuclide is incident into the selected irradiated region.

9. The ion implanter according to claim 1, wherein the ion beam irradiated target includes a plurality of irradiated regions which are positioned at locations different from each other, wherein the controller is configured to select anyone of the plurality of irradiated regions such that the estimated generation amount of the generated radioactive nuclide becomes less than a predetermined upper limit amount, and wherein the beamline includes a relative position adjustment mechanism configured to adjust a relative position between the ion beam irradiated target and the ion beam such that the ion of the first nonradioactive nuclide is incident into the selected irradiated region.

10. The ion implanter according to claim 1, wherein the ion beam irradiated target includes a first irradiated region which is formed of a first solid material including the second nonradioactive nuclide and a second irradiated region which is formed of a second solid material which includes the second nonradioactive nuclide with a concentration lower than that of the first solid material or does not include the second nonradioactive nuclide, wherein the controller is configured to select the first irradiated region in a case where an energy of the ion beam is in a first energy range and to select the second irradiated region in a case where the energy of the ion beam is in a second energy range higher than that of the first energy range, and wherein the beamline includes a relative position adjustment mechanism configured to adjust a relative position between the ion beam irradiated target and the ion beam such that the ion of the first nonradioactive nuclide is incident into the selected irradiated region.

11. The ion implanter according to claim 10, wherein the second solid material includes an element having an atomic number larger than that of the second nonradioactive nuclide.

12. The ion implanter according to claim 10, wherein the second energy range is an ultrahigh energy range higher than or equal to 4 MeV.

13. The ion implanter according to claim 1, wherein the ion beam irradiated target is configured as a beam current measuring instrument provided in the beamline, and wherein the controller calculates at least one of the estimated radiation dosage of the generated radioactive ray and the estimated generation amount of the generated radioactive nuclide based on an actually measured beam current which is measured by the beam current measuring instrument.

14. The ion implanter according to claim 1, wherein the ion beam irradiated target is configured to be at least a part of either one of the following: a beam deflection unit, an aperture plate, a beam shutter, a beam damper, a wafer support portion, or a wafer.

15. An ion implanter, comprising:

an ion source configured to generate an ion beam including an ion of a first nonradioactive nuclide;

a beamline configured to support an ion beam irradiated target including a first irradiated region and a second irradiated region; and a controller configured to select the first irradiated region in a case where an energy of the ion beam is in a first energy range and to select the second irradiated region in a case where the energy of the ion beam is in a second energy range higher than the first energy range, wherein the beamline includes a relative position adjustment mechanism configured to adjust a relative position between the ion beam irradiated target and the ion beam such that the ion of the first nonradioactive nuclide is incident into the selected irradiated region, wherein the first irradiated region is formed of a first solid material including a second nonradioactive nuclide different from the first nonradioactive nuclide, and wherein the second irradiated region is formed of a second solid material which includes the second nonradioactive nuclide with a concentration lower than the concentration of the second nonradioactive nuclide in the first solid material or does not include the second nonradioactive nuclide.

16. An ion implantation method, comprising:

generating an ion beam including an ion of a first nonradioactive nuclide;

supporting an ion beam irradiated target formed of a solid material including a second nonradioactive nuclide different from the first nonradioactive nuclide; and calculating at least one of an estimated radiation dosage of a radioactive ray and an estimated generation amount of a radioactive nuclide generated by a nuclear reaction between the first nonradioactive nuclide and the second nonradioactive nuclide.

\* \* \* \* \*